US012647085B2

(12) United States Patent
Carbone

(10) Patent No.: US 12,647,085 B2
(45) Date of Patent: Jun. 2, 2026

(54) AUDIO PROCESSING SYSTEM

(71) Applicant: Scaler Plugin Pty Ltd, St Kilda (AU)

(72) Inventor: Davide Carbone, St Kilda (AU)

(73) Assignee: Scaler Plugin Pty Ltd, St. Kilda (AU)

( * ) Notice: Subject to any disclaimer, the term of this patent is extended or adjusted under 35 U.S.C. 154(b) by 296 days.

(21) Appl. No.: 18/389,122

(22) Filed: Nov. 13, 2023

(65) Prior Publication Data

US 2025/0070738 A1 Feb. 27, 2025

(30) Foreign Application Priority Data

Aug. 25, 2023 (AU) ................................ 2023902745

(51) Int. Cl.
*H03G 5/16* (2006.01)
*H03G 3/30* (2006.01)
(52) U.S. Cl.
CPC ........... *H03G 5/165* (2013.01); *H03G 3/3089* (2013.01)
(58) Field of Classification Search
CPC ...... H03G 5/165; H03G 3/3089; H03G 5/025; H03G 3/00; G10H 2210/205; G10H 2210/265
USPC ...................... 381/61, 103; 84/609, 630, 707
See application file for complete search history.

(56) References Cited

U.S. PATENT DOCUMENTS

| | | | |
|---|---|---|---|
| 7,208,670 B2 | 4/2007 | Sim et al. | |
| 8,389,845 B2 * | 3/2013 | Kunimoto | G10H 7/04 |
| | | | 84/625 |
| 8,618,402 B2 * | 12/2013 | Rutledge | G10H 1/36 |
| | | | 84/669 |
| 8,642,875 B2 | 2/2014 | Kinter | |
| 10,262,643 B1 | 4/2019 | Kinter | |
| 10,847,170 B2 * | 11/2020 | Atti | G10L 21/038 |
| 12,073,144 B2 * | 8/2024 | Lazaroff | G10H 1/0008 |
| 12,087,260 B1 | 9/2024 | Kinter | |
| 2002/0117045 A1 * | 8/2002 | Mita | G10H 1/0041 |
| | | | 84/609 |
| 2009/0132242 A1 * | 5/2009 | Wang | G10L 21/04 |
| | | | 381/63 |
| 2015/0228288 A1 * | 8/2015 | Subasingha | G10L 21/038 |
| | | | 704/500 |
| 2017/0148460 A1 * | 5/2017 | Atti | G10L 19/032 |

OTHER PUBLICATIONS

ChordSpace Playa Wayback Machine Dec. 5, 2011: chordspace. com, URL: http://www.chordspace.com/index.htm, Videos made using version: 1.0, accessed as of Apr. 27, 2021, 1 page.

(Continued)

*Primary Examiner* — Xu Mei
(74) *Attorney, Agent, or Firm* — Cozen O'Connor

(57) ABSTRACT

A signal processing system for adjusting an audio signal, the signal processing system configured to: receive an audio signal for adjustment at a signal input; at a function generator, receive a selection of a musical key and scale, the musical key and scale including musical notes, and generate an audio signal processing function, configured to adjust the amplitude of frequencies of an audio signal, the audio signal processing function being dependent on the selected musical key and scale; apply the generated audio signal processing function to the received audio signal to generate an adjusted audio signal; and, output the adjusted audio signal at a signal output.

19 Claims, 29 Drawing Sheets

(56) References Cited

OTHER PUBLICATIONS

J74 HarmoTools 2.0.1, URL: https://maxforlive.com/library/device. php?id=1177; accessed as of Apr. 27, 2021, 14 pages.

Piz MIDI Plugins—Insert Piz Here Forum—KVR Audio, Oct. 22, 2010, URL: https://www.kvraudio.com/forum/viewtopic.php?t= 300566; accessed as of Apr. 27, 2021, 22 pages.

Real Guitar 5—Manual 2012, URL: https://www.musiclab.com/ assets/files/RealGuitar.pdf; Videos made using version: Real guitar 3, accessed as of Apr. 27, 2021, 112 pages.

* cited by examiner

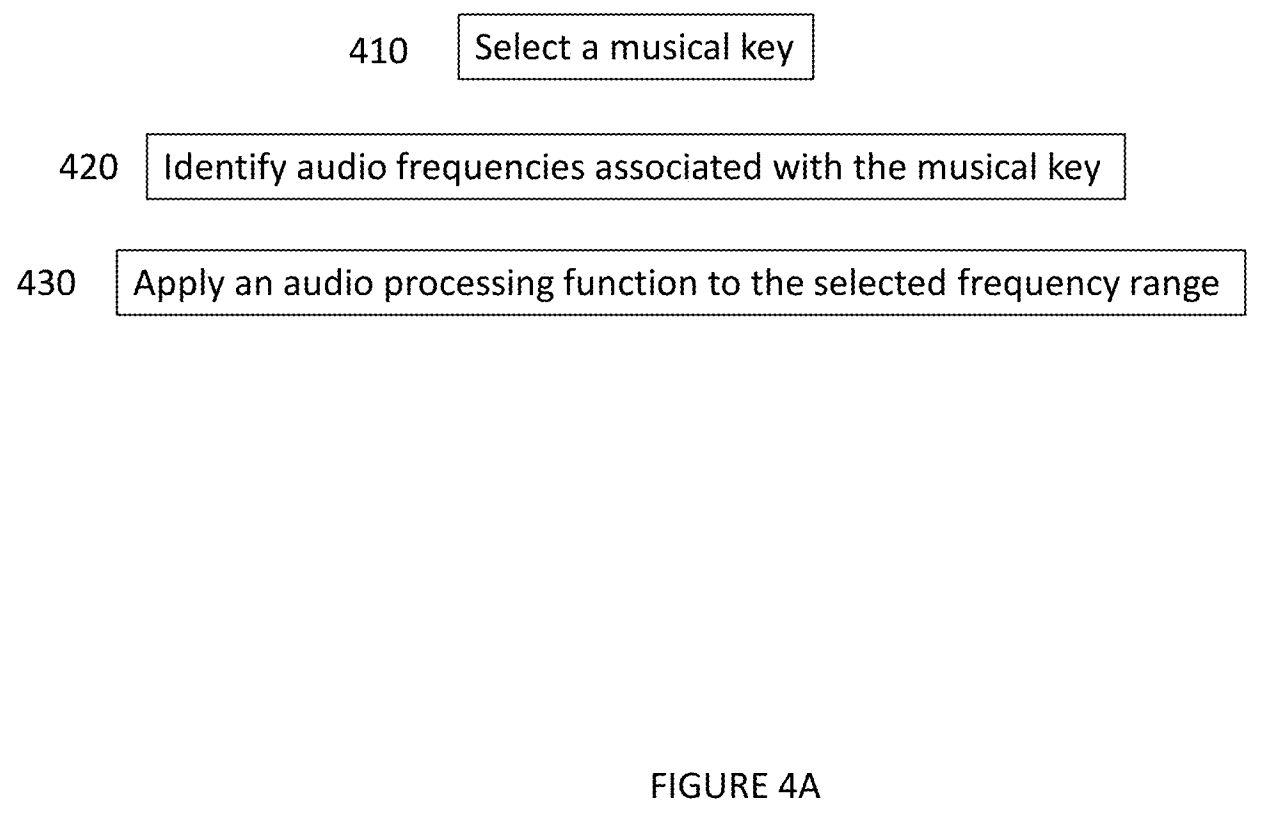

410     Select a musical key

420     Identify audio frequencies associated with the musical key

430     Apply an audio processing function to the selected frequency range

FIGURE 4A

AUDIO PROCESSING SYSTEM

FIELD OF INVENTION

The present invention relates to an audio processing system and in particular to an equalizer (or EQ).

BACKGROUND

One of the most common audio processing techniques used in music production is equalization. The system used to perform equalization is an equalizer, also referred to as an EQ. Equalization allows an audio signal to be adjusted (produced) by manipulating the frequency content of the audio signal by changing the amplitude (volume) of frequencies in the audio signal. The amplitude of frequencies can be adjusted by applying a gain to increase (boost) the amplitude of a particular frequency or frequency range or decrease (cut) the amplitude of a particular frequency or frequency range. By increasing the amplitude of frequencies in an audio signal those frequencies become louder and more prominent in the audio signal. By reducing the amplitude of frequencies in an audio signal those frequencies become quieter and less prominent in the audio signal. This changes the sound. The result is that equalization changes the frequency balance of the sound. Music producers often use an EQ to boost or cut different instruments, vocals or sounds, or to remove noise from the audio signal, generally for the purpose of improving the quality of a music track.

The main settings (parameters) for an equalizer include: centre frequency, Q (Q stands for quality but is also referred to as Range) parameter, and gain:

Centre frequency is the midpoint frequency for the equalizer.

Q parameter defines the width of the frequency range affected by the equalizer and is defined as the centre frequency divided by the bandwidth of the equalizer in Hertz. When looking at the frequency response curve of an equalizer in a frequency vs gain display the Q factor defines the sharpness of the curve. A high Q parameter produces a steeper shape on the equalizer. This allows specific frequencies to be selected and adjusted. A low Q parameter has a more shallow shape and is applied more gradually across a wider frequency range. The frequencies in the equalizer may be described as the 'band' of frequencies of the equalizer. The width of the equalizer may be referred to as the bandwidth of the equalizer.

The EQ increases or decreases the amplitude of particular frequencies of an audio signal. Gain is the multiplier applied to the affected frequency band and is measured in decibels (dB). A positive gain increases the amplitude of the frequency, this is often referred to as boosting. A negative gain reduces the amplitude of the frequency. The shape of the equalizer typically follows a bell curve function where the centre frequency has the highest gain and the gain is reduced progressively away from the centre frequency according to the Q parameter.

The settings of the equalizer define the position and shape of the signal processing function that the equalizer applies to an audio signal.

Traditional EQs have predefined locked centre frequencies and bandwidths and so provide amplitude adjustment across a fixed range of frequencies. The amplitude can be adjusted by applying a gain (gain multiplier) for the fixed frequency range. Traditional equalizers include graphic equalizers. The whole equalizer may include multiple equalizer bands (or windows), each being a separate signal processing function. Each equalizer band can be positioned at predefined centre frequency and cover a different frequency band. For example, an audio processing system may include three equalizer windows positioned on a typical frequency range extending from low frequencies of 20 Hz up to high frequencies of 20 kHz, with one equalizer window covering a low-range frequency band (bass) between about 20 Hz to 300 Hz, one covering a mid-range frequency band between around 300 Hz to 2 kHz and one covering a high-range frequency band (treble) between around 4 kHz to 15 kHz. Traditional equalizers allow independent gain control for each of the predefined frequency ranges, so each frequency range may be adjusted to be boosted, cut, or unaffected.

Parametric equalizers provide greater control over the adjustment of frequencies in an audio signal. Parametric equalizers allow the centre frequency of the equalizer window to be selected by a user within the frequency range of the system. Movement of the centre frequency is often called 'sweeping'. This sweeping function allows a music producer to specifically select a frequency range for adjustment. This allows a music producer to respond to the sound of the track and provides much greater equalization flexibility compared with traditional equalizers. Some parametric equalizers also allow adjustment of the Q factor for an equalizer band (window). This provides music producers with control over the frequency range affected by the equalizer. Gain is typically also controllable in a parametric EQ.

Equalizers may be analogue or digital. Analogue equalizers apply filters to analogue audio signals. Analogue equalizers use electrical circuits typically including electrical components such as resistors and capacitors to adjust frequencies in an audio signal. Digital equalizers apply filters and amplification to audio signals using digital signal processing techniques. Digital equalizers may be available as software plugins for digital audio workstations (DAWs).

Audio signals may require adjustment during music production. When an audio signal is adjusted the waveform is changed. There are many reasons why an engineer or producer may wish to adjust an audio signal but the objective is to change the amplitude of various frequencies within the audio signal either to remove or reduce particular frequencies or boost other frequencies. This changes the shape of the waveform and when the adjusted signal is converted into sound it produces a different sound from the input signal. In one example, the audio signal may include unwanted noise. The noise may originate from many sources, for example background noise across wide frequency ranges originating from a refrigerator or an air conditioning unit. The noise may be localised to a more specific frequency range, for example an alarm or beeping from a phone. In other examples, the audio signal may include out-of-tune notes from an instrument or vocals from a microphone and there is a desire to remove these from the recording or to at least reduce their prominence in the recording. In other examples, an engineer or producer may wish to change the amplitude contrast of frequencies by boosting the amplitude of particular notes to make them more prominent.

Adjustment of audio signals is a complicated technical process. Prior art systems including EQs provide music producers and sound engineers with the ability to adjust the amplitude of frequency bands in an audio signal, typically based on bell-shaped amplifying EQ functions. These functions affect all frequencies within the frequency band, regardless of whether those frequencies are desired or not. This is a complicated and time consuming process and typically requires a well trained ear or extensive production experience to achieve good results.

Embodiments adjust the audio signal by applying an amplification function to the audio signal which is locked to a particular key and scale. The amplification function creates a group of amplification peaks at different frequencies. These peaks are linked based on a particular key and scale. Within a frequency band, the gain applied to an audio is adjusted depending on key and scale. This allows different frequencies to be adjusted depending on key and scale. These frequencies are grouped automatically. When the amplification function is applied to the audio signal, the frequencies associated with the particular key and scale, for example frequencies of in-key notes or frequencies of out-of-key notes, can be selectively boosted (i.e. by applying positive gain) or cut (i.e. by applying a negative gain) from the audio signal. This provides a coherent approach to audio signal processing. It is flexible for the user, through flexibility of key and scale selection and other settings. By facilitating signal adjustment based on key and scale and allowing the grouping of multiple amplitude gain peaks within a frequency range, embodiments provide an efficient way to adjust an audio signal. This can allow noise to be removed from a signal or the relative amplitude of certain frequencies to be changed. Embodiments reduce the complexity of signal adjustment and can be used by amateur producers and engineers as well as experienced professionals.

STATEMENTS OF INVENTION

Embodiments of the present invention apply signal processing to an audio signal based on the key and scale.

Music tracks are typically composed in a specific key and scale. The key of the music includes a particular group of notes (tones). Each note has a specific frequency. Within a frequency range of an equalizer, some frequencies may be associated with notes in the key of the music track (in-key) and others are not. Embodiments adjust an audio signal across the frequency range of the equalizer in dependence on key and scale. The audio signal can be adjusted across the frequency range of the equalizer in dependence on the specific key and scale of the music track.

In embodiments the equalizer processes frequencies of the audio signal within the frequency range of the equalizer dependent on whether or not the frequency is in-key of the music track. Frequencies of the audio signal which are in-key are adjusted differently from those that are not in key.

Frequencies of the audio signal that are in-key may be boosted preferentially. Frequencies that are in-key may be boosted with a greater gain than those that are not in-key.

The particular group of notes that are not in the key of the music track are out of key (out-of-key). In some embodiments the equalizer can be set to cut or reduce frequencies of the audio signal preferentially that correspond to out-of-key notes. These out-of-key audio frequencies can be reduced or removed from the audio signal, with either a cut or subtle dynamic suppression (soothing). In other embodiments the frequencies of out-of-key notes may be boosted.

In accordance with an aspect of the invention there is provided a signal processing system for adjusting an audio signal, the signal processing system configured to: receive an audio signal for adjustment at a signal input; at a function generator, receive a selection of a musical key and scale, the musical key and scale including musical notes, and generate an audio signal processing function, configured to adjust the amplitude of frequencies of an audio signal, the audio signal processing function being dependent on the selected musical key and scale;

apply the generated audio signal processing function to the received audio signal to generate an adjusted audio signal; and, output the adjusted audio signal at a signal output.

In accordance with an aspect of the invention there is provided a method for adjusting an audio signal, comprising: receiving an audio signal for adjustment; receiving a selection of a musical key and scale, the musical key and scale including musical notes; and generating an audio signal processing function, the audio processing function configured to adjust the amplitude of frequencies of an audio signal, the audio signal processing function being dependent on the selected musical key and scale;

applying the generated audio signal processing function to the received audio signal to generate an adjusted audio signal; and, outputting the adjusted audio signal.

In accordance with an aspect of the invention there is provided a method for generating a signal processing function for adjusting an audio signal, comprising: receiving a selection of a musical key and scale, the musical key and scale including musical notes; and generating an audio signal processing function, the audio processing function configured to adjust the amplitude of frequencies of an audio signal, the audio signal processing function being dependent on the selected musical key and scale.

In accordance with an aspect of the invention a signal processing system for adjusting an audio signal is provided, the signal processing system configured to receive a selection of a musical key and scale at an input, the musical key and scale including musical notes; provide an audio signal processing function at a function generator, configured to adjust the amplitude of frequencies of an audio signal, the audio signal processing function being dependent on the selected musical key and scale.

In embodiments, the signal processing function is configured to adjust the amplitude of frequencies of an audio signal, the signal processing function adjusting the amplitude of frequencies of an audio signal in dependence on the selected musical key and scale. The signal processing function may be further dependent on whether the frequency corresponds to a musical note.

In further embodiments the amplitude of a frequency of the audio signal is adjusted in dependence on whether that frequency corresponds to a musical note which is in the selected musical key and scale or out of the selected musical key or scale. The signal processing function may be configured to disproportionately adjust the amplitude of frequencies of notes which are in the selected musical key and scale or out of the musical key and scale compared with other frequencies. The signal processing function may be configured to increase the amplitude of the frequency (boost) or decrease the amplitude of the frequency (cut).

In embodiments the signal processing function includes multiple peaks in gain, the peaks being positioned at frequencies in dependence on the selected musical key and scale.

In further embodiments the signal processing function has a selected frequency range, the signal function being configured for adjusting an audio signal across the selected frequency range. The signal processing function may include a shape function which defines the amplitude adjustment for frequencies of notes within the selected frequency range. The shape function may be a bell curve function. The shape function may be symmetrical within the frequency range.

In embodiments the signal processing function comprises a peak function, the peak function defines the relationship between the peak amplitude adjustment applied to note frequency and the amplitude adjustment applied to adjacent frequencies. The peak frequency may be a bell curve function.

In a further aspect the invention provides a signal processing system wherein the signal processing function comprises a first signal processing function according the another aspect and a second signal processing function, the first signal processing function and the second function both adjusting the amplitude of frequencies in an audio signal and having an overlapping frequency range, wherein the total amplitude adjustment applied to frequencies in the overlapping frequency range is a combination of the amplitude adjustment of the first signal processing function and the second signal processing function.

The second signal processing function may be any of a shelf function or a signal processing function according to another aspect.

In accordance with a further aspect the invention provides a signal processing system further comprising: receiving an input audio signal at a signal input; applying the signal processing function to the input audio signal at a signal processor to produce an adjusted audio signal.

The selection of a musical key and scale may be performed automatically or received from a manual input.

In accordance with a further aspect the invention provides a method for adjusting an audio signal, comprising: receiving a selection of a musical key and scale at an input, the musical key and scale including musical notes; providing an audio signal processing function at a function generator, configured to adjust the amplitude of frequencies of an audio signal, the audio signal processing function being dependent on the selected musical key and scale.

Embodiments may comprise receiving an input audio signal at a signal input; applying the signal processing function to the input audio signal at a signal processor to produce an adjusted audio signal.

The selection of a musical key and scale is performed automatically or received from a manual input.

In accordance with a further aspect the invention provides a computer software module configured to implement the method of another aspect when executed on a computing device.

In accordance with a further aspect the invention provides a signal processing function for adjusting an audio signal which can have a musical key and scale including musical notes, the signal processing function being configured to adjust an amplitude of the audio signal at a sound frequency of one or more of the musical notes of the musical key a scale.

The signal processing function may be configured to adjust an amplitude of a frequency of the audio signal dependent on a selected musical key and scale, the selected musical key and scale including musical notes. The signal processing function may be configured to adjusting the amplitude of frequencies of an audio signal, the signal processing function adjusting the amplitude of frequencies of an audio signal in dependence on the selected musical key and scale. The signal processing function being further dependent on whether the frequency corresponds to a musical note.

The amplitude of a frequency of the audio signal may be adjusted in dependence on whether that frequency corresponds to a musical note which is in the selected musical key and scale or out of the selected musical key or scale. The signal processing function may be configured to disproportionately adjust the amplitude of frequencies of musical notes which are in the selected musical key and scale or out of the musical key and scale compared with other frequencies. The signal processing function may be configured to increase the amplitude of the frequency (boost) or decrease the amplitude of the frequency (cut).

The signal processing function may have a selected frequency range, the signal function being configured for adjusting an audio signal across the selected frequency range. The signal processing function may comprise a shape function which defines the amplitude adjustment for frequencies of notes within the selected frequency range. The shape function may be a bell curve function. The shape function may be symmetrical within the frequency range.

The signal processing function may comprise a peak function, the peak function defining the relationship between the peak amplitude adjustment applied to note frequency and the amplitude adjustment applied to adjacent frequencies. The peak frequency may be a bell curve function.

In accordance with a further aspect of the invention a combined signal processing function is provided comprising a first signal processing function according to any other aspect and a second signal processing function, the first signal processing function and the second function both adjusting the amplitude of frequencies in an audio signal and having an overlapping frequency range, wherein the total amplitude adjustment applied to frequencies in the overlapping frequency range is a combination of the amplitude adjustment of the first signal processing function and the second signal processing function.

The second signal processing function may be any of a shelf function or a signal processing function according to any other aspect.

In accordance with a further aspect the invention provides an audio processing system comprising: receiving a selection of a musical key and scale, the musical key and scale including musical notes; generating an audio signal processing function for adjusting an input audio signal, the audio signal processing function being dependent on the selected musical key and scale.

In accordance with a further aspect the invention provides an audio processing function further comprising receiving a selection of a frequency range for audio processing, the audio signal process function for adjusting the input audio signal across the selected frequency range.

The audio processing function may further comprise applying the audio signal processing function to an input signal to produce an adjusted audio signal. The audio processing function is a gain function for applying a gain to frequencies of the input audio signal, the gain applied a frequency is dependent on the selected musical key and scale. The audio processing function may define a gain function, the gain function defining the gain applied to frequencies within the window. The signal processing function may have a shape within the selected frequency range, the shape function defining the gain applied to different frequencies within the selected frequency range. The shape may be a bell curve. The shape may be symmetrical about a centre frequency of the selected frequency range.

The audio processing system may further comprise: determining the frequency of at least one of the musical notes the frequency being the note frequency; and wherein the audio processing function processes frequencies of the audio signal within the frequency range dependent on whether the frequency of the audio signal is a note frequency. The audio signal processing function may preferentially boost frequencies of the audio signal corresponding to note frequencies the notes appearing in the scale (in-key frequency boost). The audio signal processing function may preferentially cut frequencies of the audio signal corresponding to notes not included in the scale.

The audio signal processing function may define a maximum gain applied to frequencies of the frequency range, those frequencies that are preferentially boosted or cut being boosted or cut at the maximum gain defined for that frequency. The shape may be symmetrical about a selected frequency. The selected frequency being the centre frequency.

Multiple audio signal processing functions may be generated for adjusting an audio signal and, when audio processing functions overlap frequencies, the audio processing function for that frequency is a combination of the audio signal processing functions.

In a further aspect, the invention provides an audio processing system comprising: an input for receiving a selection of a musical key and scale, the musical key and scale including musical notes; and a processor for generating an audio signal processing function for adjusting an input audio signal, the audio signal processing function being dependent on the selected musical key and scale.

In a further aspect the invention provides a method for generating an audio signal processing function comprising: receiving a selection of a musical key and scale, the musical key and scale including musical notes; generating an audio signal processing function for adjusting an input audio signal, the audio signal processing function being dependent on the selected musical key and scale.

In a further aspect the invention provides a method for adjusting an audio signal comprising: receiving a selection of a musical key and scale, the musical key and scale including musical notes; generating an audio signal processing function for adjusting an input audio signal, the audio signal processing function being dependent on the selected musical key and scale; and applying the audio signal processing function to an input signal to produce an adjusted audio signal.

In a further aspect, the invention provides an audio processing system comprising: selecting or detecting a musical key and scale; identifying notes in the selected musical key and identify the frequency of those notes; receive an audio signal; select a frequency range for audio processing; applying an audio processing function to the selected frequency range of the audio signal, the audio processing function is dependent on the selected musical key and scale.

Known equalizers, apply a signal processing function across a selected frequency range which is defined by centre frequency, gain of centre frequency, bandwidth and shape (Q parameter). Examples of the invention perform audio processing based on a selected key and scale.

An advantage of embodiments of the present invention is that frequencies of an audio signal are selectively adjusted in dependence on the musical key and scale. Frequencies are selectively adjusted depending on whether the frequency is in-key or out-of-key. The gain applied to different frequencies is dependent on whether the frequency is in-key or out-of-key. For example, frequencies that are in key are boosted selectively within a frequency range in preference to those that are out of key. Frequencies that are out of key may be cut selectively within a frequency range in preference to those that are in key. Example embodiments adjust the audio processing function automatically based on musical key and scale.

BRIEF DESCRIPTION OF THE FIGURES

In order that the invention be more clearly understood and put into practical effect, reference will now be made to preferred embodiments of an assembly in accordance with the present invention. The ensuing description is given by way of non-limitative example only and is with reference to the accompanying drawings, wherein:

FIGS. 4A and 4B show steps performed by an audio processing system.

DETAILED DESCRIPTION

Figure 1:
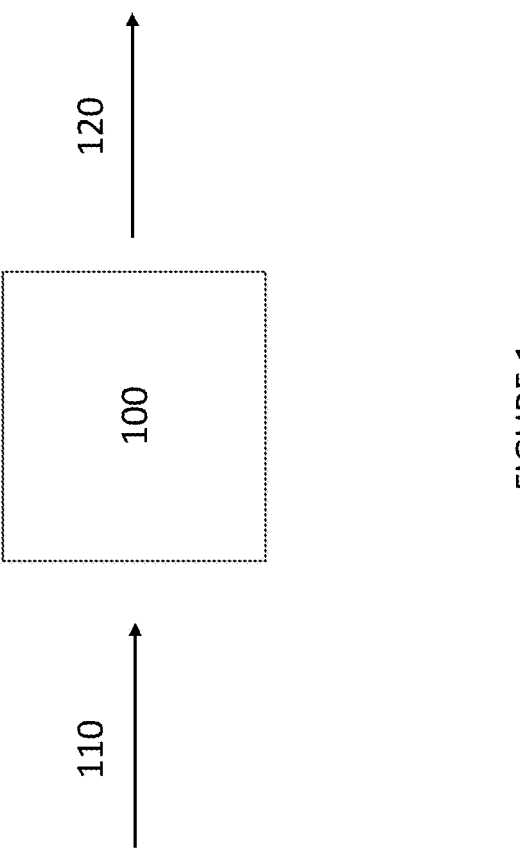
FIG. 1 shows an equalizer.

An equalizer is shown in FIG. 1. Equalizer 100 receives input signal 110. The input signal is an audio signal. The audio signal is in the form of a waveform. Equalizer applies signal processing to input signal 110 according to its signal processing function as defined by its various adjustment parameters. The adjustment parameters define the amplitude gain applied to various frequencies within the audio signal. The gain for a particular frequency may be a positive gain (i.e. boost) to increase the amplitude of a frequency or a negative gain (i.e. cut) to reduce the amplitude of a frequency. The gain value may be zero. The signal processing function defines the amplitude gain applied to frequencies of the audio signal. During signal processing the amplitude gain defined in the signal processing function is applied to the frequencies of the audio signal to create an output signal 120. After signal processing, equalizer 100 outputs adjusted output signal 120. After adjustment by equalizer 100, the waveform of output signal 120 is different from the waveform of input signal 110. When the output signal is converted into sound, for example at a speaker or headphones, output signal 120 has a different sound from input signal 110 due to the change in waveform. The sound has been adjusted.

Equalizer 100 may be an analogue equalizer or a software based digital equalizer. Analogue equalizers are electronic circuit based hardware components. The electronic circuit typically includes various filters (including combinations of capacitors and resistors) and amplifiers. Settings for the analogue converter may be controlled by physical knobs and buttons, but may also be digitally controlled. When an input signal is input into the analogue equalizers the electronic components of the equalizer adjust the input signal, changing the sound and producing and adjusted output signal.

Digital equalizers are built in software modules. Digital equalizers are programmed to process the input signal digitally and create the same effect as hardware components. These digital equalizers may use algorithms which are applied to an input audio signal to adjust the signal. After digital signal processing, the output signal from the digital equalizer is adjusted compared with the input signal and so when it is converted to sound it has a different sound compared with the input signal.

Equalizers (EQs) can be controlled by a control system, typically referred to as a Digital Audio Workstation (DAW) in music production. A DAW is an electronic device or an application software run on a computer system. DAWs may be used for producing music and may also be used for producing other audio content.

Figure 2:
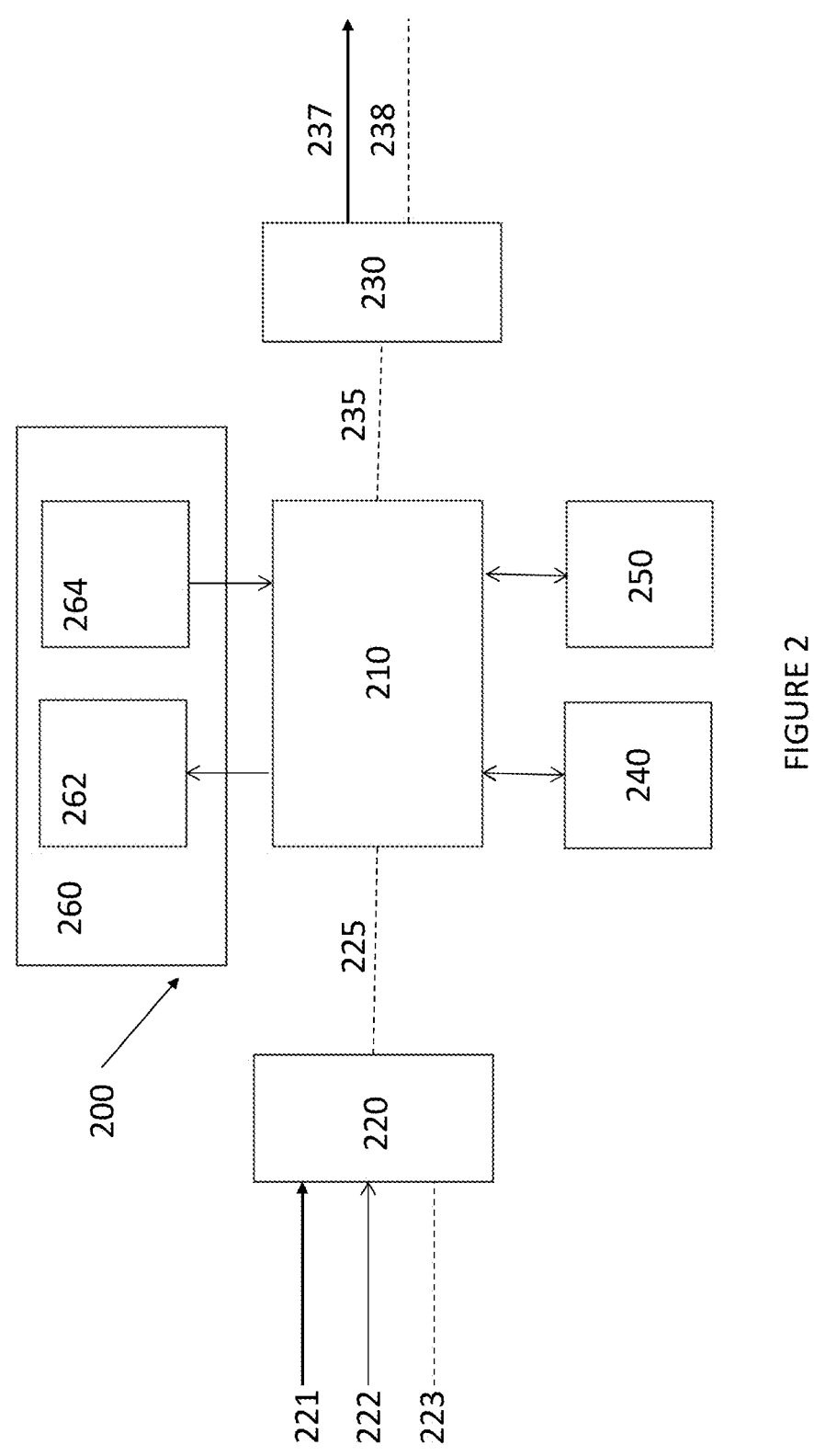
FIG. 2 shows components of an example of a music production system.

Components of an example of a music production system 200 are shown in FIG. 2. DAW 210 is the control centre for music production system 200. DAW 210 may be an electronic device or a software module executed in a computer system.

Input interface 220 receives input signals from sound sources and converts them to digital signals. In the example of FIG. 2, interface 220 receives multiple input signals. These input signals may be different signal types, including analogue 221, MIDI 222, digital 223. Interface 220 may receive signals from multiple different sources, for example analogue input from a microphone and a guitar, MIDI input from a MIDI keyboard and audio input from an analogue or digital keyboard, synthesizer, sound module. A typical musical set up may include a microphone input, a keyboard and a drum machine. Interface 220 may include multiple interfaces to receive these different signal types: an analogue interface including an analogue to digital converter or soundcard to receive audio signals and convert to digital, for example from a microphone or guitar; an audio input from an analogue or digital keyboard, synthesizer, sound module to receive audio input signals.

Signals from different sources are received on different input channels, for example a microphone input is received on a separate channel from a guitar input. But in some cases these may already be mixed onto a single channel.

Interface 220 converts input signals to digital signals 225. The digital signal is a digital representation of the waveform. Digital signals 225 may be put on separate channels by interface 220, for example separate inputs may be converted to separate digital channels, for example the microphone input is converted to a digital microphone signal, the guitar input is converted to a digital guitar signal. In some examples the interface may combine (mix) the channels onto a single channel.

Interface 220 may be incorporated into a physical computer system (for example a soundcard) or it may be external to the computer system as an external device.

System 200 includes memory 240. Memory may store various software modules for execution by the music production system. For example EQ software plugin modules may be stored in memory 240. Memory 240 may store digital tracks or samples or virtual instruments (including drums, piano etc) which may be included during music production. Memory 240 can be read by DAW 210 and may also be written to for storage. Memory 240 may be internal to the physical computer system or may be externally connected.

EQ 250 generates the signal processing function and performs signal processing on the digital signals. This may be a software module executed on processor(s) to adjust the digital audio signal. The processor(s) may form part of the DAW.

EQ 250 includes a function generator. The function generator generates a signal processing function to be applied to the audio signal. The user can control the signal generator via the user interface 260. Typically, the function generator is part of the EQ plugin 250. User interaction with the EQ plugin allows a user to generate a signal processing function. The signal processing function can be applied to an audio signal to adjust the signal.

The signal processing function generated by the EQ is applied to the audio signal. The amplitude function of the EQ defines the gain to be applied to frequencies of the audio signal. EQ 250 may have designated processors or the signal processing may be performed on the processors of DAW 210. In other embodiments the processors may be remote and accessed via a communications network, for example by sending the audio signal and the signal processing function generated by the EQ to the remote processors via a communication network.

For each frequency, the processor applies the gain for that frequency as defined by the signal processing function of the EQ to the amplitude of the audio signal for that frequency. The amplitude of that frequency of the audio signal is adjusted, depending on the gain value from the amplitude function, and the adjusted audio signal is output signal 230.

The system 200 is controlled via user interface 260. User interface 260 includes graphical display 262, typically displaying the mixing screen, and user input device 264. User interface 260 may present a digital representation of the amplitude function to be applied to the audio signal. Graphical display 262 and user input device 264 may be combined as a single graphical user interface for example a touchscreen or touchpad. In other systems, the user input device may be a separate device including a keypad, mouse, screen, MIDI keyboard. Multiple user input devices and/or multiple graphical display devices 262 may be included within user interface 260.

Output signal 235 is outputted. The output signal is outputted for conversion to sound, for example by being output to a speaker or headset, or for recording, for example by outputting the output signal to a memory.

The output signal 235 is received by output interface 230. Output interface 230 may include a digital to analogue converter to convert digital output signal 235 into analogue output 237, for example for connection to an analogue speaker or headphones. Output interface 230 may provide digital output 238 for connection to digital devices, including digital speakers, digital headphones etc.

Input interface 220 and output interface 230 may be combined as a single interface.

Some or all of the components of system 200 may be co-located in a single physical device or may be connected externally. Connections may be provided over communications networks, including wireless communication networks, mobile communication networks and internet. For example, the processors may be remote from the user. Input audio signals and EQ signal processing functions may be transmitted across a communications network to a remote processor for mixing and the adjusted signal returned across the communications network to audio output interface 230.

Although EQ 250 may be defined above as a software component, in some embodiments it is implemented as a hardware EQ system. In these embodiments the audio signal is fed into the EQ for adjustment.

Figure 3:
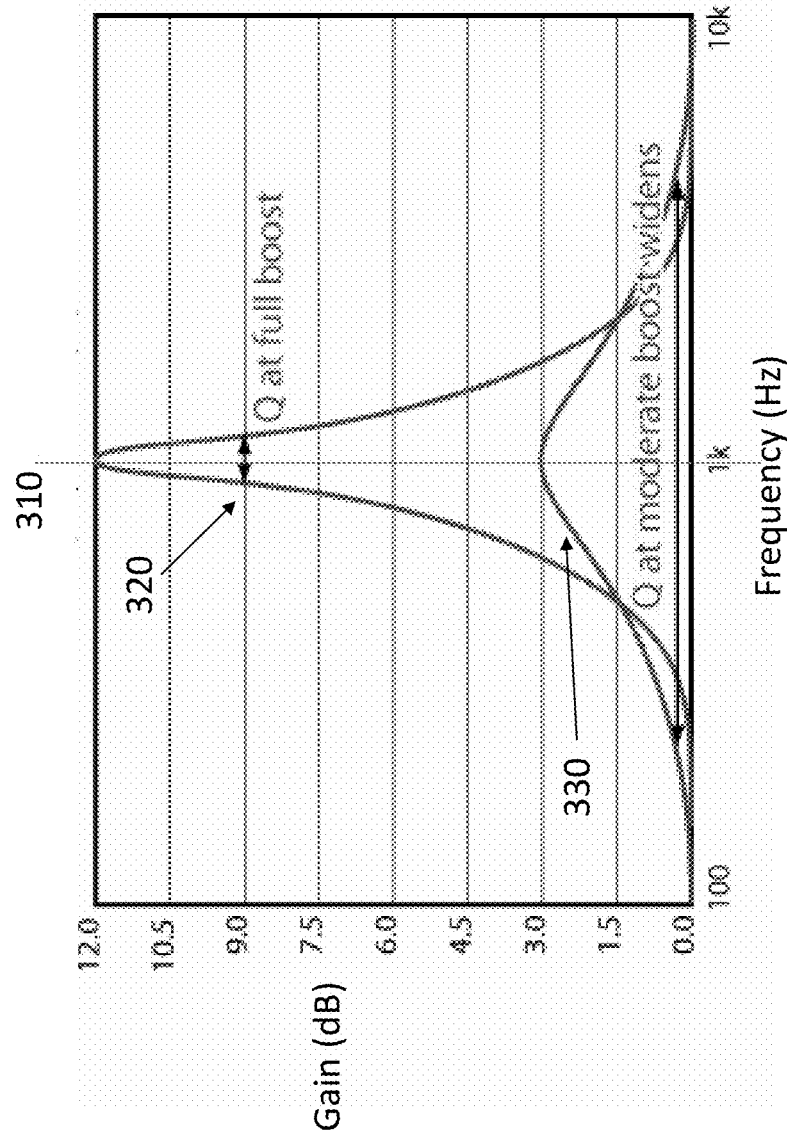
FIG. 3 shows an example of a frequency response curve.

An example of a signal processing function (also referred to frequency response curve or amplification function or audio processing function) generated by an equalizer is shown in FIG. 3 to illustrate the main settings of the equalizer. The frequency processing function defines the gain in decibels applied to different frequencies of an input signal. Frequency in Hertz is represented on a logarithmic scale on the x-axis, gain is represented in decibels (dB) on the y-axis The main settings (parameters) of the signal processing function shown in FIG. 3 include: centre frequency, Q parameter, and gain:

Centre frequency 310 is the midpoint frequency for the equalizer (signal processing function). In the example of FIG. 3 the midpoint frequency is 1 kHz.

Q parameter defines the shape (or sharpness) of the signal processing function. In the example of FIG. 3, curve 320 is sharper than curve 330. The Q parameter for curve 320 is higher than that of curve 330. The higher the Q parameter, the sharper the drop in gain away from the centre frequency.

Gain is the multiplier applied to the affected frequency and is measured in decibels (dB). In the frequency response curves of FIG. 3, the maximum gain of curve 320 is 12 dBs. The maximum gain of curve 330 is 3.0 dB. The maximum gain occurs at the centre frequency. Both curve 320 and 330 apply positive gain (boost) when applied to audio signals. Other frequency processing functions may apply a negative gain (cut) to audio signals. In the example of FIG. 3, the gain reduces symmetrically at frequencies away from the centre frequency and the function is represented by a bell curve.

The frequency response curves shown in FIG. 3 are typical of those used in equalizers. The centre frequencies are usually set manually. The curves of FIG. 3 boost all frequencies within the bandwidth of the equalizer according to the gain level of the frequency response curve at each frequency.

Referring to a standard piano keyboard, a keyboard is arranged into repeatable octaves. An octave includes twelve notes including the seven natural notes (tones) of the C major scale (C, D, E, F, G, A, B) on the white keys of the keyboard, and the five notes which are not part of the C major scale (C#/Db, D#/Eb, F#/Gb, G#/Ab, A#/Bb) on the black keys of the keyboard. Octaves repeat on a keyboard from low pitch on the left side and up through higher octaves as the notes move to the right. Each note has a distinct frequency. When two notes are an octave apart the frequency of the higher one is twice that of the lower one. For example, the frequencies 440 Hz and 880 Hz both correspond to the note A. Frequencies of the note C include 130.82 Hz and 261.32 Hz.

In musical theory, scales are sets of notes of the octave and typically include seven notes of the octave. Different scales may include different notes. The first note of the scale is often referred to as the tonic (keynote or rootnote). There are different types of scales, and the scales are defined by the pattern of intervals between the notes in an upward direction starting from the tonic. One of the common scales used in music is the major scale. The interval pattern of the major scale starting from the tonic is: tone, tone, semitone, tone, tone, tone, semitone. For example, C major scale has a tonic C and includes the notes C, D, E, F, G, A, B. G major scale has the tonic G and includes the notes G, A, B, C, D, E, F#.

Another common scale is the minor scale. The interval pattern of the minor scale starting from the tonic is: tone, semitone, tone, tone, semitone, tone, tone. For example, C minor scale has the tonic C and includes the notes C, D, Eb, F, G, Ab, Bb. G minor scale has the tonic G and includes the notes G, A, Bb, C, D, Eb, F.

There are many scale types each having different interval patterns, some of these are major, minor, diatonic, pentatonic. Every key also has it's own mode. A mode is simply a scale pattern that can begin on any note in the scale, not just the root. Modes are variations on scales, which are one of the fundamental elements of tonal music. Examples of modes include C Phrygian or C Mixolydian.

Different scales can include the same notes. For example, on a standard piano keyboard, the white keys of C, D, E, F, G, A, B form the C major scale. The white keys also form the A minor scale of A, B, C, D, E, F, G. These scales are referred to as the relative major and minor scales. Although the notes of the scales are the same, when the scales are played starting from the tonic, the different interval patterns produce a different tune to the scale.

Typically, music compositions are written using the notes of a selected key and scale. These notes appear through the composition. Notes within the scale are said to be 'in-key' and sound in tune when they appear in the composition. Notes which are not in the scale may sound out of place in the composition, these notes are referred to as 'out-of-key'.

The scale used for a music composition is referred to as the key. When listening to a music composition the keynote (the tonic of the scale) often stands out. It often appears at the start and end of the composition and throughout the composition. That keynote along with the other notes in the composition and the intervals between them indicate the scale (or the key) of the composition.

For a composition including the notes A, B, C, D, E, F, G for which C is the keynote, is in the key of C major. To the listener's ear, the notes of C major are 'in key'. Notes that do not appear in the scale of C major, for example Bb, will sound out of key in the composition.

An audio signal processing system for processing an audio signal is now described in which the system receives a selection of a musical key and scale. The audio processing system processes an input audio signal dependent on the selected musical key and scale to produce an output audio signal. The system processes the input audio signal across a selected frequency range.

The process steps performed by the audio signal processing system are now described with reference to FIG. 4A. The process steps are performed in an EQ as part of a music production system. In the music production system for processing an input audio signal, the system selects a music key and scale at 410. The music key and scale may be input manually by a user via user input device 264 and receive at DAW 210. In some examples music production system 200 may include autodetecting functions for automatically detecting the scale and key of a composition. In these systems the key and scale is selected automatically by the system. The notes and the frequencies of the notes forming the identified key and scale are identified at 420. At 430 the EQ 250 applies an audio processing function to the input audio signal to adjust the gain of the input signal and create an output signal, where the audio processing function is dependent on the identified key and scale.

Figure 4B:
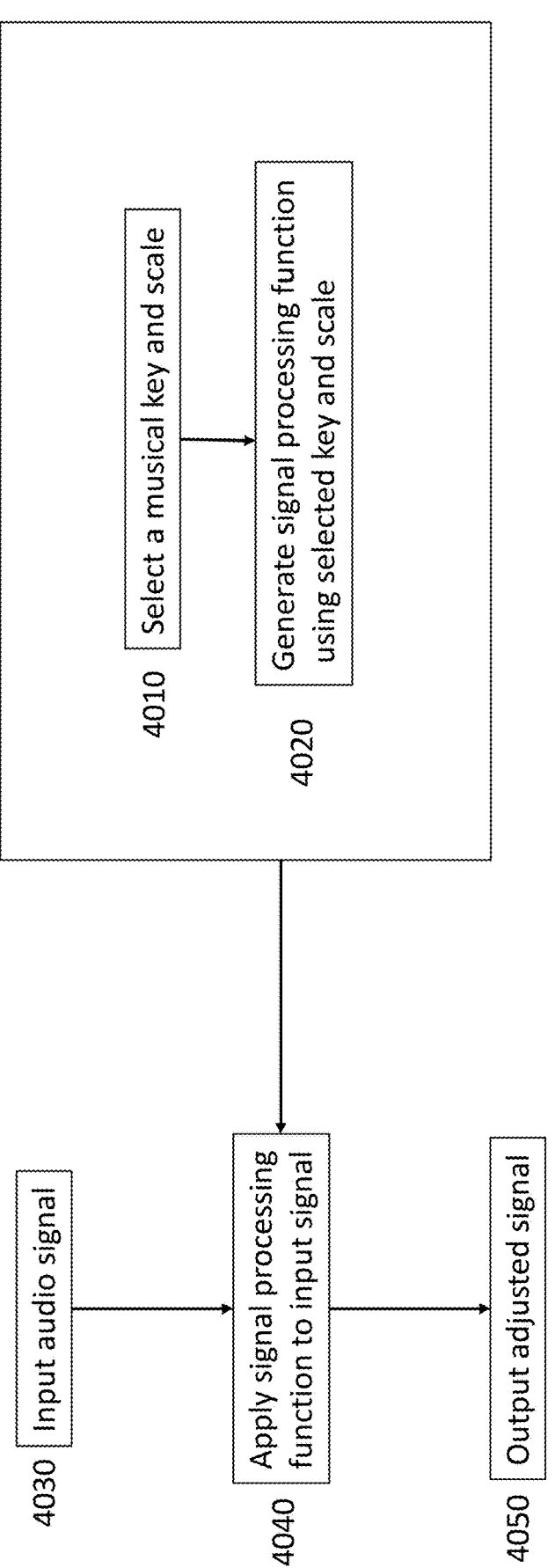

FIG. 4B shows the process steps performed to adjust an input audio signal. At 4020 a signal processing function is generated. The signal processing function is generated at a function generator. The function generator may form part of the EQ module 250. The EQ module may be a software plugin for the DAW 210. As described, the function generator generates a signal processing function based on various settings, including musical key and scale 4010. Other settings may be provided to the function generator including frequency range for the signal processing function, gain and other settings. The signal processing function may be displayed to the user via user interface 260.

An audio signal is input at 4030. At 4040 the signal processing function is applied to the audio signal. The signal processing function defines the gain applied to different frequencies of the audio signal. For each frequency within the range of the signal processing function, the gain of the frequency defined by the signal processing function is applied to the amplitude of the frequency of the audio signal. The amplitude of the signal is adjusted by the gain to produce an adjusted signal. The adjusted signal is output at 4050.

Figure 5:
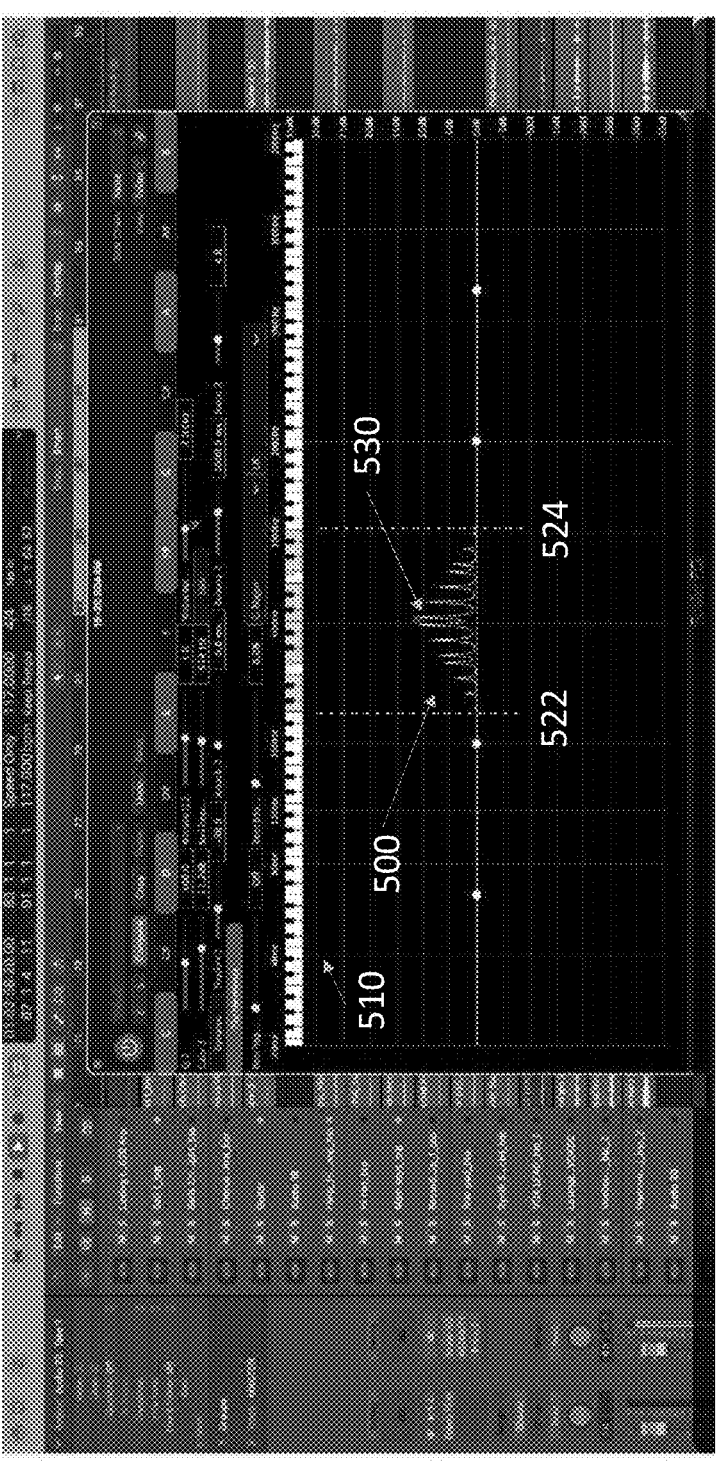
FIG. 5 shows a digital representation of an example of an audio processing function to be applied to an input signal.

An example of an audio processing function 500 applied to an input signal by EQ 250 of the music production system 200 is shown in FIG. 5. The audio processing function 500 shown in FIG. 5 is a digital representation of the gain applied to various frequencies of the audio signal. Audio processing function 500 is displayed on Graphical User Interface 262 and can be adjusted by the user using various settings. The x-axis represents frequency. The y-axis represents gain applied to that frequency. The audio processing function is illustrated as displayed on user interface 260 of music production system 200. The key and scale are set to G major, meaning that the notes G, A, B, C, D, E, F# are in the scale. The keynote is G.

In FIG. 5, audio signal processing function 500 is shown represented on a frequency axis (Y-axis) covering frequencies between of 20 Hz to 20,000 Hz and on a gain axis (X-axis) covering gain between +35 dB to −35 dB. An animation of a keyboard 510 is illustrated in FIG. 5, and the notes of the keyboard are displayed above the frequency axis at a position corresponding to their frequency. The dashed lines of FIG. 5 are shown for clarity only and do not form part of the function.

Audio signal processing function 500 has a bandwidth (also referred to as a window) which defines the frequency range over which it adjusts an input audio signal. In the example of FIG. 5 the window extends between the frequency represented by 522 and extends to the frequency represented by 524. For clarity, the notes of the G major scale that appear within the window are displayed and highlighted on keyboard 510. In the example of FIG. 5, the window extends from C in the mid-range to B, covering two full octaves. The audio processing function processes frequencies within the window dependent on whether or not a frequency is the frequency of a note of the scale.

Figure 6:
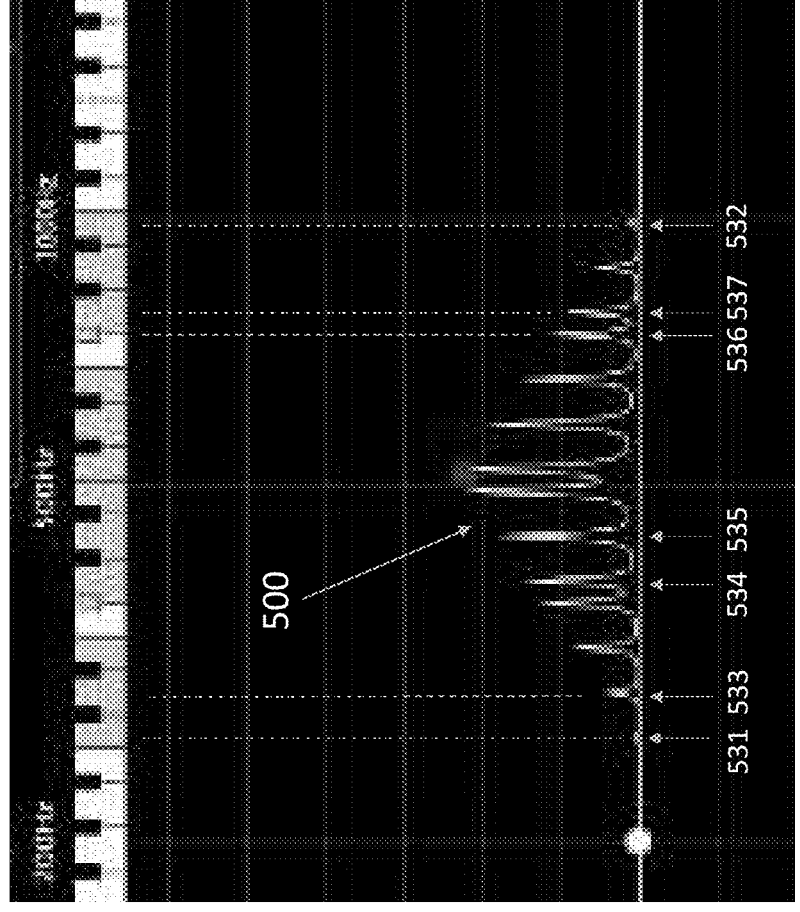
FIG. 6 shows a digital representation of an example of an audio processing function to be applied to an input signal.

FIG. 6 is an enlarged view of the window shown in FIG. 5. Within the window, the audio signal processing function 500 includes a series of peaks, the higher the peak, the greater the gain applied to that frequency of an input signal. The peaks are peaks in the gain. A peak in gain provides a high gain multiplier for that frequency compared with adjacent frequencies, hence producing a peak in in the function. In FIG. 6, the window includes multiple peaks in gain. The peaks are positioned at the frequencies of notes in the selected key and scale (G major). This is illustrated by the peaks appearing below the corresponding notes of the keyboard. For example, the peak 531 is positioned at the lowest frequency of the peaks within the window and appears at the frequency of the note C. The peak 532 is positioned at the highest frequency within the window and appears at the frequency of the note B. Between peak 531 and 532, twelve further peaks appear corresponding to the 12 notes of the G major scale between the C and B notes across the two octaves of the window.

As described above, the peaks are positioned at frequencies corresponding to the notes of the scale G major. The pattern of the peaks of the signal processing function depends on the scale. The frequency gaps between the peaks are the frequency gaps between adjacent notes of the scale and represent the intervals between the notes. For example, peak 531 is at the frequency of note C and adjacent peak 533 is at the frequency of note D in the upward direction. The interval between the C and D notes is one tone and the frequency gap between peak 531 and 533 corresponds to a tone. Likewise, peak 534 is at the frequency of note G and adjacent peak 535 is at the frequency of note A in the upward direction. The interval between the G and A notes is also one tone and so the corresponding peaks are separated by a gap equal to that between the C and D notes. The G major scale also includes some semi-tone intervals between notes and these produce peaks in gain for adjacent notes smaller than those for a full tone. For example, peak 536 is at the frequency of note F# and adjacent peak 537 is at the frequency of note G in the upward direction. The interval between the F# and G notes is a semitone. These peaks are separated by a frequency gap equal to a semitone.

The spacing pattern of the peaks within the window depends on the scale (i.e. the pattern of intervals between the notes of the scale) and repeats through the octaves covered by the window.

The signal processing function of FIG. 6 is positive gain (boost). It preferentially boosts the frequencies of notes that are in key compared with other frequencies. These frequencies are amplified disproportionally compared with adjacent frequencies to produce the gain peaks in the signal processing function.

Figure 7:
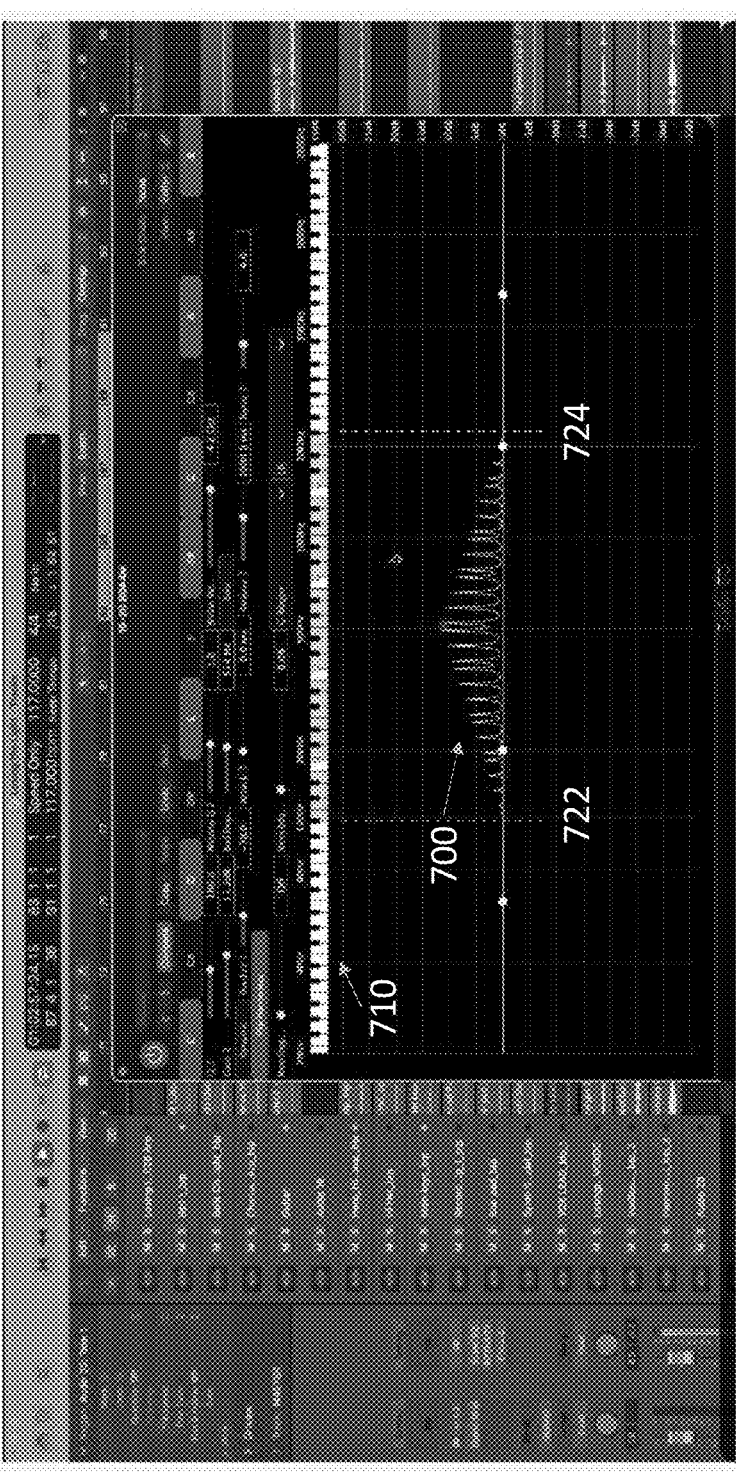
FIG. 7 shows a digital representation of an example of an audio processing function to be applied to an input signal.

The window may be widened to cover a large frequency range, or narrowed to cover a smaller frequency range. FIG. 7 shows a further positive gain (boost) signal processing function 700. The signal processing function is locked to G major scale. In the example of FIG. 7 the window (the bandwidth affected by the signal processing function) is widened compared with the signal processing function shown in FIGS. 5 and 6. In the example of FIG. 7 the window extends between the frequency represented by 722 and extends to the frequency represented by 724. For clarity, the notes of the G major scale that appear within the window are highlighted on keyboard 710. In the example of FIG. 7, the window extends from C in the mid-range to C, covering four full octaves plus the C note of the fifth octave. The audio processing function processes frequencies within the window dependent on whether or not a frequency is in-key with the scale.

The wider window of the signal processing function of FIG. 7 includes more G major scale notes than the narrower window of FIGS. 5 and 6 because it covers a wider frequency range. The G major notes (in-key) appearing within the frequency range of the signal processing function of FIG. 7 are highlighted on the displayed keyboard. A corresponding peak within the window appears at each in-key note frequency. Twenty nine in-key notes are within the window and the corresponding twenty-nine peaks appear in the signal processing function. Widening the window covers a broader frequency range and enhances the effect of the signal processing function.

As the window is widened and narrowed, the number of in-key frequencies within the window increases and decreases.

In the examples of FIGS. 5, 6 and 7 the centre frequency indicated by indicator 530 for the signal processing function is locked. By keeping the centre frequency locked, when the window is widened to increase the frequency range of the window, additional in-key frequencies are included at the high and low edges of the window. This maintains the in-key frequencies of the narrower window and adds additional in-key frequencies as the frequency range is extended to include more in-key frequencies. If the window is narrowed the opposite effect occurs in which in-key frequencies at the high and low frequencies of the window are omitted from the signal processing function as the window narrows and those frequencies are positioned outside of the window.

Figure 8:
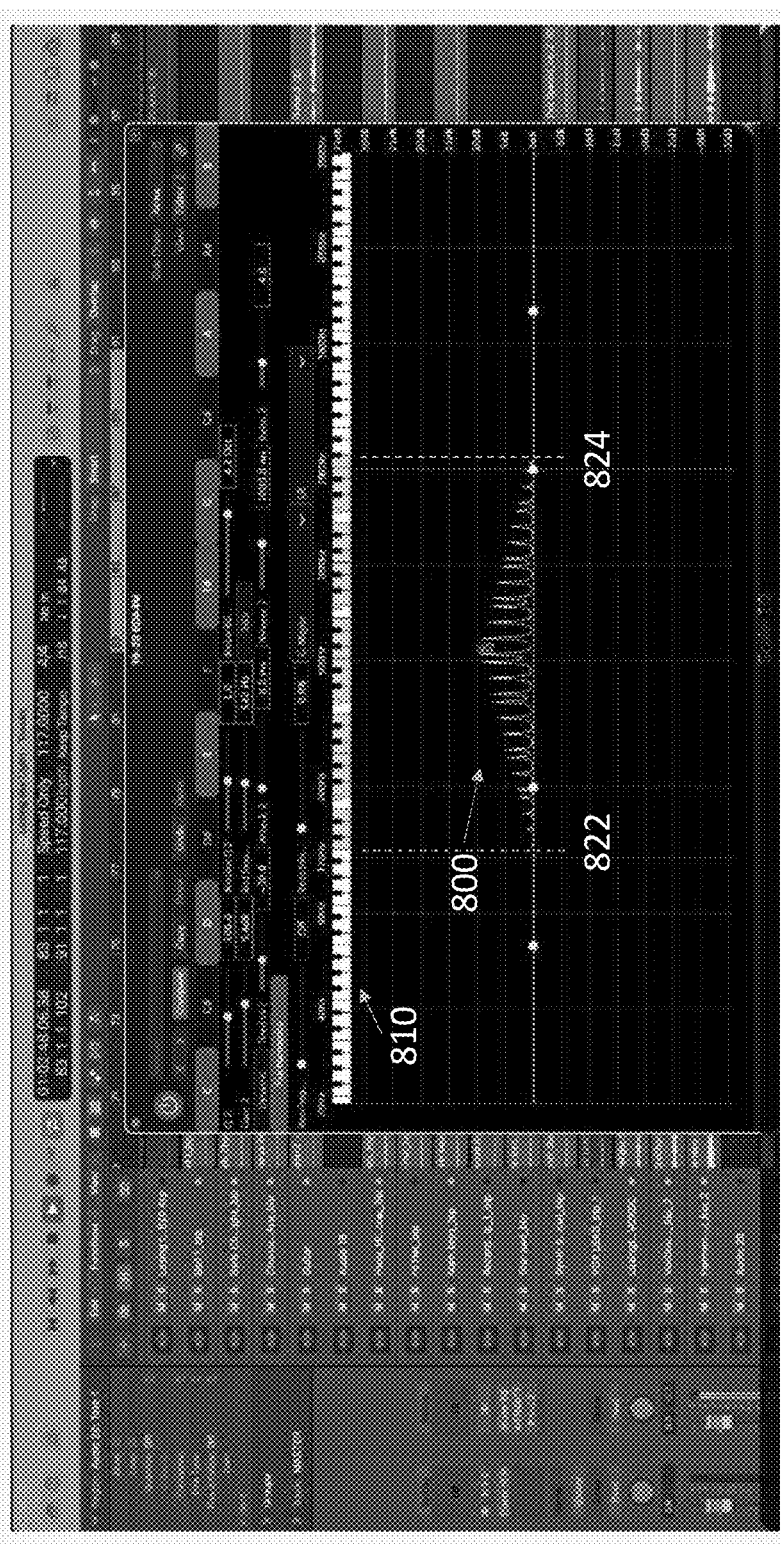
FIG. 8 shows a digital representation of an example of an audio processing function to be applied to an input signal.
Figure 9:
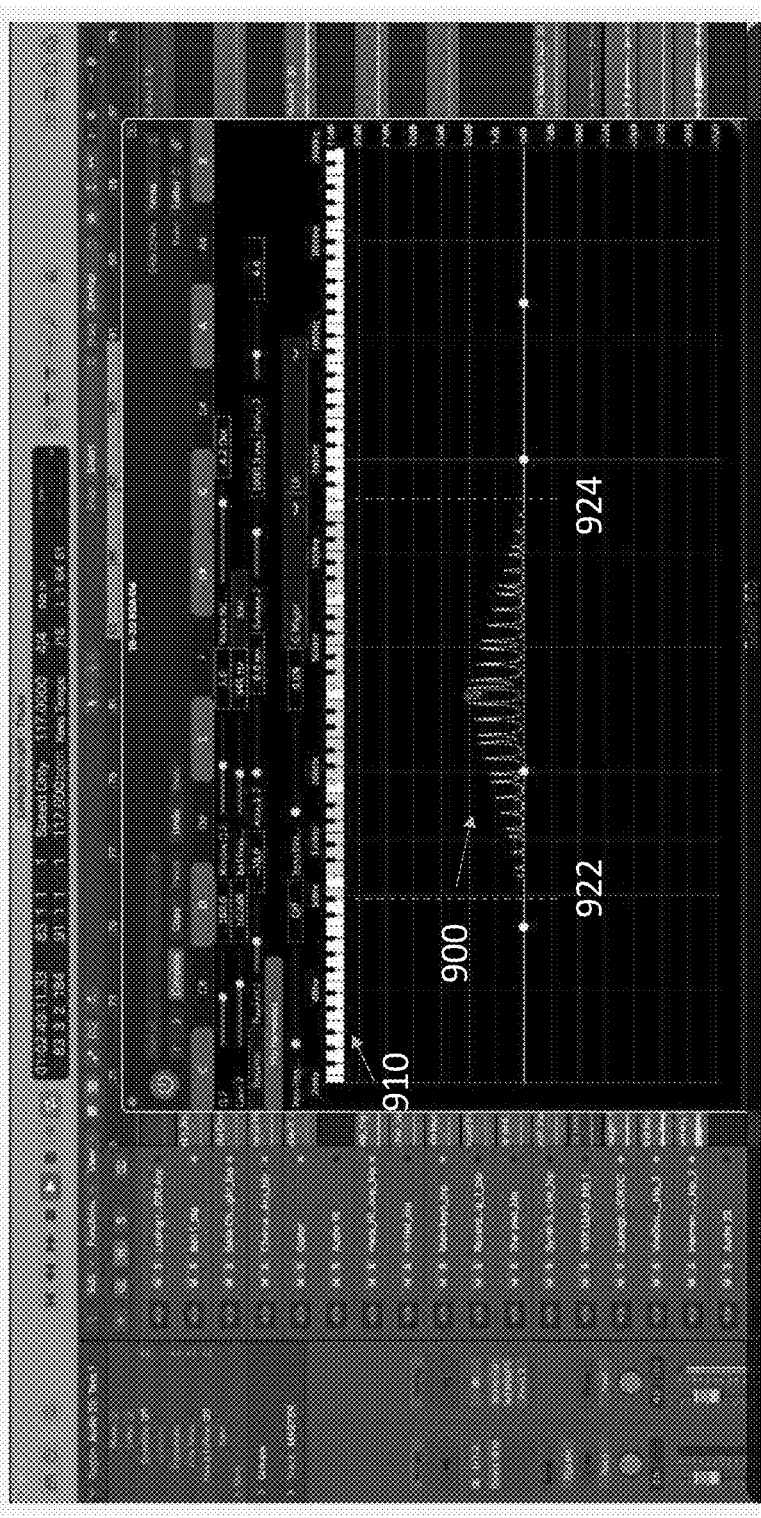
FIG. 9 shows a digital representation of an example of an audio processing function to be applied to an input signal.
Figure 10:
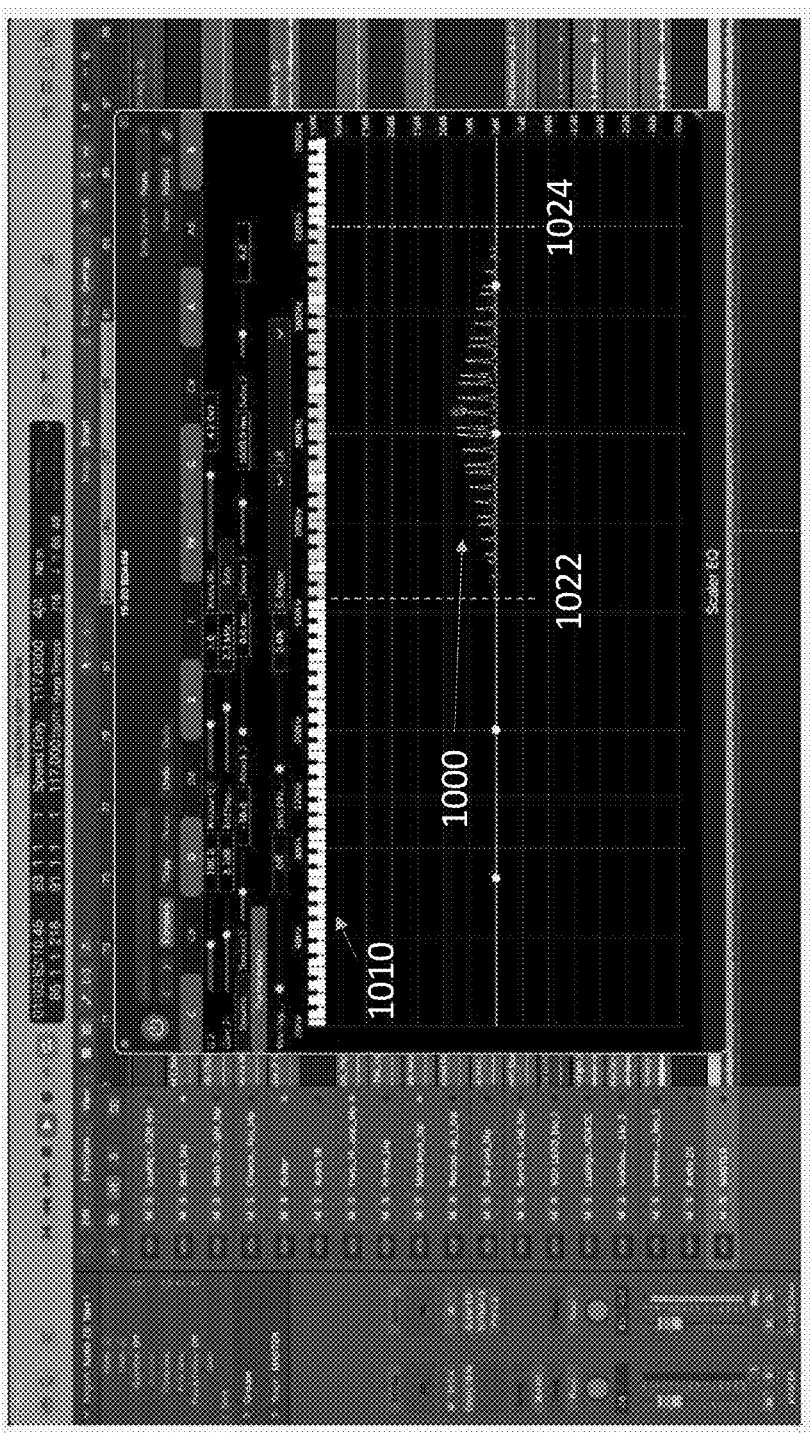
FIG. 10 shows a digital representation of an example of an audio processing function to be applied to an input signal.

The centre frequency may be adjusted and moved up and down the frequency range. This movement of the centre frequency is sometimes referred to as sweeping FIGS. 8 9 and 10 show examples of sweeping the centre frequency of the window (and signal processing function). In the examples of 8 9 and 10 the window size (i.e. width) is maintained. The signal processing function of FIG. 8 is the same function as that described above with respect to FIG. 7 covering the twenty nine in-key frequencies of the G major scale between the C note and the C note five octave above. FIG. 9 shows the same signal processing function as FIG. 8 but moved down in frequency. The window has the same bandwidth, but this time covers thirty in-key frequencies of the G major scale between the lower E note and the F# in the fifth octave above. Within the window the in-key frequencies are boosted. The window includes one additional in-key frequency because of the relative position of the centre frequency compared with the pattern of the in-key/out-of-key frequencies.

FIG. 10 shows the same signal processing function as FIGS. 8 and 9 but moved up in frequency. The window has the same width, covering twenty nine in-key frequencies of the G major scale, but now covers the frequency range between the lower D note and the D in the fifth octave above. Within the window the in-key frequencies are boosted.

In the examples of FIGS. 7 to 10 the width of the window (frequency bandwidth) of the signal processing function is the same in each of the functions. The centre frequency of the window can be moved to any frequency and can be swept smoothly up and down the frequency range. Consequently, depending on the exact position of the centre frequency the window may include thirty or twenty-nine in-key frequencies. In some embodiments the center frequency may be locked to in-key frequencies and so hop up and down between frequencies as it is swept rather than sweep smoothly up and down the frequency range.

Figure 11:
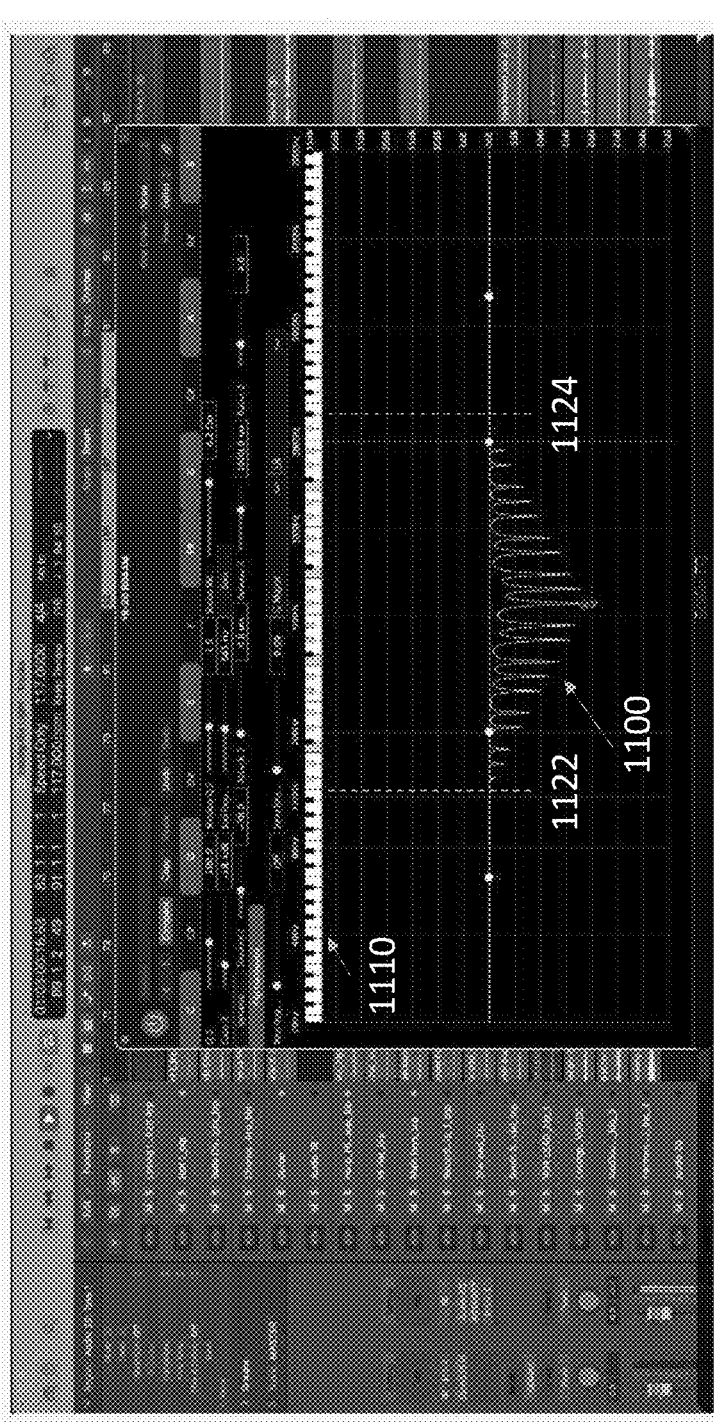
FIG. 11 shows a digital representation of an example of an audio processing function to be applied to an input signal.

The functions of FIGS. 5 to 10 are boost functions, boosting the in-key frequencies. FIG. 11 shows a cutting function which removes out-of-key frequencies. As described above, in-key notes of a scale are those notes which appear in the scale, for G major the in-key notes are G, A, B, C, D, E, F#. Those notes which are not part of the G major scale are out-of-key notes, namely: Ab/G#, Bb/A#, C#Db, D#/Eb, F. The frequencies of these out-of-key notes are the out-of-key frequencies of G major. These out-of-key notes and frequencies are also referred to as inharmonics.

The function of FIG. 11 is a cutting function. The gains of this function are negative and when they are applied to the audio signal they have the effect of reducing or removing those frequencies.

The function of FIG. 11 is again set to the key of G major. When the function is set to a cutting function the system identifies the frequencies of the out-of-key notes of the G major scale, i.e. the frequencies of notes Ab/G#, Bb/A#, C#Db, D#/Eb, F. These frequencies are preferentially cut, indicated by the negative gain peaks in function 1100.

Figure 12:
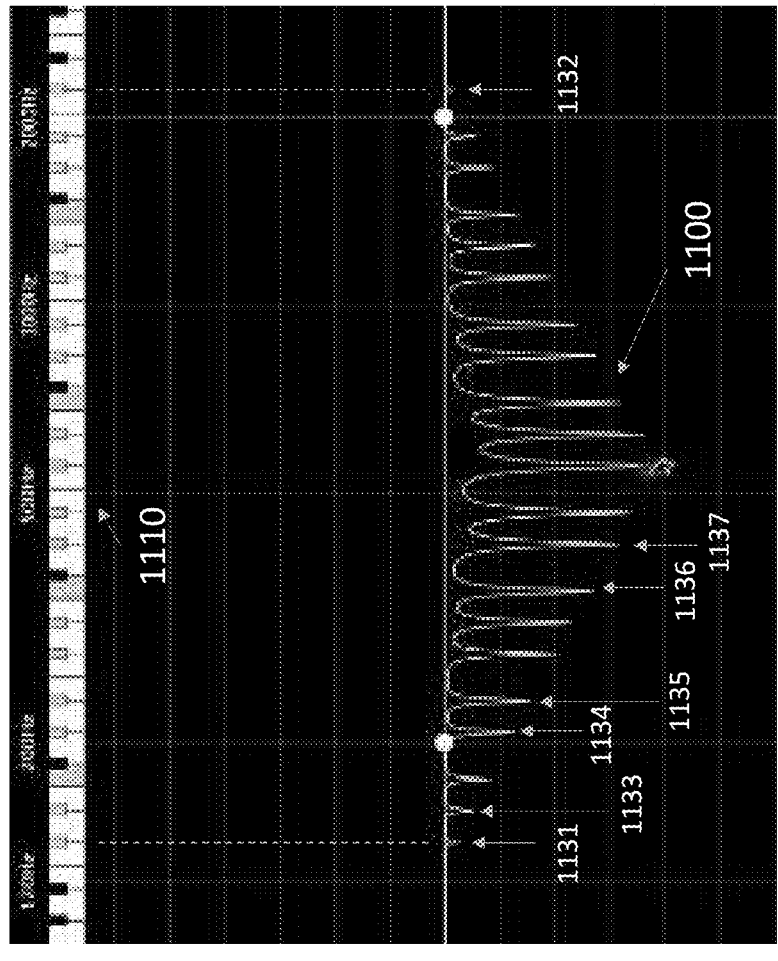
FIG. 12 shows a digital representation of an example of an audio processing function to be applied to an input signal.

FIG. 12 is an expanded view of the window shown in FIG. 11 and uses the same labelling. Within the window, the audio processing function 1100 includes a series of peaks, the higher the peak, the greater the gain applied to an input signal. In cutting functions, the gain is a negative gain (i.e. –dB). The peaks are positioned at the frequencies of the out-of-key notes of the selected key and scale (G major). The keyboard is displayed above the frequency axis. The out-of-key notes of the selected G major key are highlighted. The peaks of audio processing function 1100 appear below the corresponding notes of the keyboard. For example, peak 1131 has the lowest frequency of the peaks within the window and appears at the frequency of the note C#/Db. The peak 1132 has the highest frequency within the window and appears at the frequency of the note C#/Db four octaves above the peak 1131. Between peak 1131 and 1132, twelve further peaks appear at frequencies corresponding to the 19 out-of-key notes of the G major scale between the C#/Db note 1131 and the C#/Db note 1132 four octaves above.

As described above, the peaks in the gain are positioned at frequencies corresponding to the out-of-key notes of the scale G major. In the cutting function, the pattern of the peaks of the audio processing function depends on the scale. The frequency gaps between the peaks are the frequency gaps between adjacent out-of-key notes of the scale and represent the intervals between those out-of-key notes. For example, peak 1131 is at the frequency of note C#/Db and adjacent peak 1133 is at the frequency of note D#/Eb in the upward direction. The interval between the C# and D# notes is one tone and the frequency gap between peak 1131 and 1133 corresponds to a tone. Likewise, peak 1134 is at the frequency of note G#/Eb and adjacent peak 1135 is at the frequency of note A#/Bb in the upward direction. The interval between the G# and A# is also one tone and so the corresponding peaks are separated by a gap equal to that between the C# and D# notes. The intervals between some of the out-of-key notes of the G major scale are larger than one tone, for example peak 1136 is at the frequency of note F and adjacent peak 1137 is at the frequency of note G#/Ab in the upward direction. The interval between the F and G# notes is one and half tones. These peaks are separated by a frequency gap equal to one and a half tones.

The spacing pattern of the peaks within the window depends on the scale (i.e. the pattern of intervals between the notes of the scale) and repeats through the octaves covered by the window.

In some example implementations, the system automatically swaps between the in-key boosting function and the out-of-key cutting function when the user selects between the boosting and cutting functions.

FIGS. 13 to 16 show further examples of signal processing functions using positive (boost) and negative (cut) gains to be applied to frequencies of input audio signals.

Figure 13:
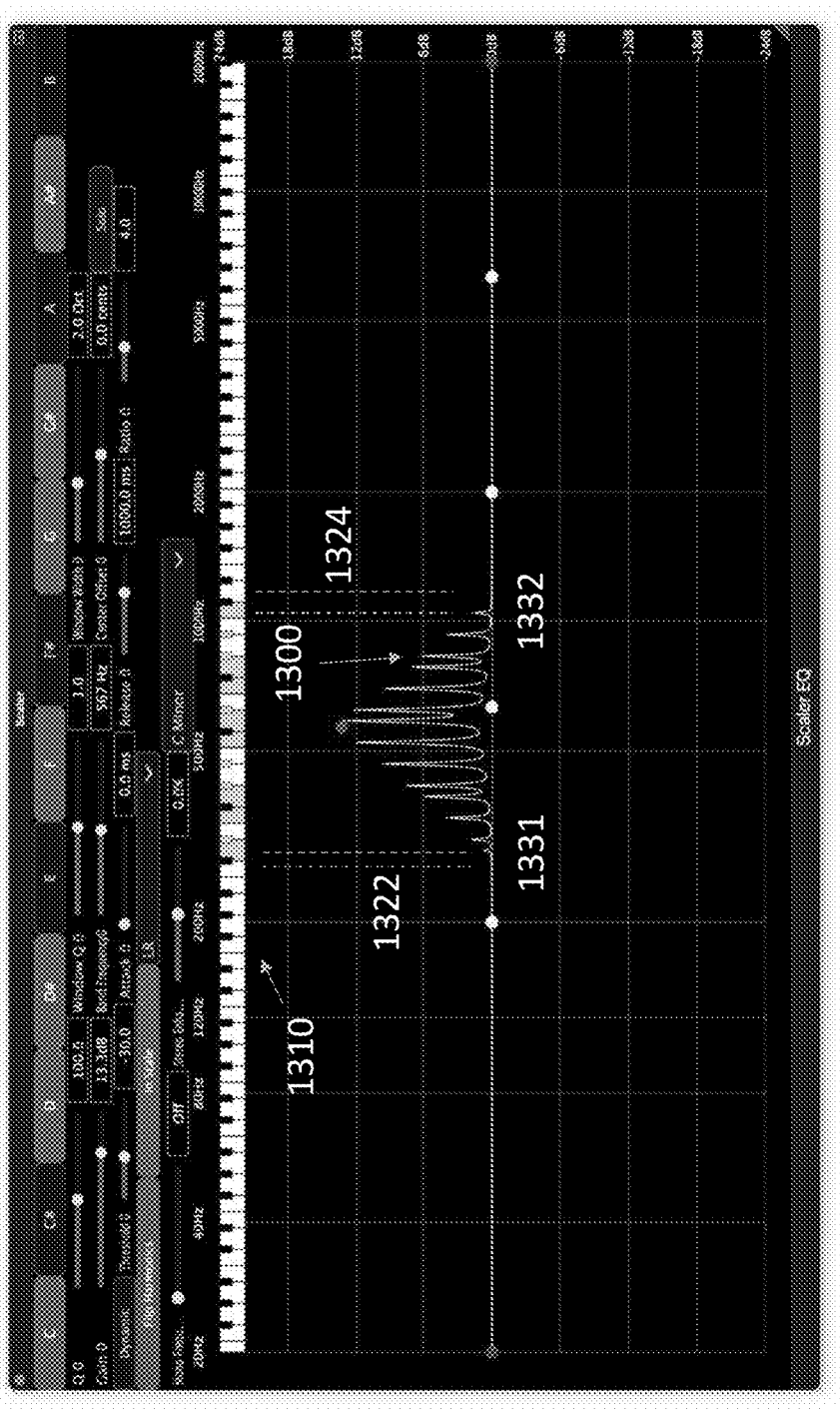
FIG. 13 shows a digital representation of an example of an audio processing function to be applied to an input signal.

In FIG. 13, audio signal processing function 1300 is shown represented on a frequency axis (Y-axis) covering frequencies between of 20 Hz to 20,000 Hz and on a gain axis (X-axis) covering gain between +24 dB to −24 dB. An animation of a keyboard 1310 is illustrated in FIG. 13, and the notes of the keyboard are displayed above the frequency axis at a position corresponding to their frequency. The dashed lines of FIG. 13 are shown for clarity only and do not form part of the function.

Audio processing function 1300 has a bandwidth which defines the frequency range over which it processes an input audio signal. In the example of FIG. 13 the window extends between the frequency represented by 1322 and extends to the frequency represented by 1324. The audio processing function 1300 applies a positive gain (boost) to selective frequencies between 1322 and 1324. The audio processing function of FIG. 13 is tuned to the key of C minor. The C minor scale includes the notes C D Eb F G Ab Bb. So for the C minor scale the in-key notes are C D Eb F G Ab Bb. The out-of-key notes are C# E F# A B.

For clarity, the notes of the C minor scale that appear within the window are displayed and highlighted on keyboard 1310. In the example of FIG. 13, the window extends from D in the mid-range to C, covering two full octaves. The audio processing function processes frequencies within the window using the C minor scale.

The signal processing function shown in FIG. 13 is configured to boost the in-key frequencies of the C minor scale within the window in preference to other frequencies. Within the window, the signal processing function 1300 includes a series of peaks, the higher the peak, the greater the gain applied to an input signal. The peaks are positioned at the frequencies of notes in the C minor key and scale. Again, this is illustrated by the peaks appearing below the corresponding notes of the keyboard. For example, the peak 1331 has the lowest frequency of the peaks within the window and appears at the frequency of the note D. The peak 1332 has the highest frequency within the window and appears at the frequency of the note C. Between peak 1331 and 1332, twelve further peaks appear corresponding to the 12 notes of the C minor scale between the D and C notes across the two octaves of the window.

The pattern of the peaks of the signal processing function depends on the scale. The frequency gaps between the peaks are the frequency gaps between adjacent notes of the scale and represent the intervals between the notes. For example, peak 1331 is at the frequency of note D and adjacent peak 1333 is at the frequency of note Eb (D#) in the upward direction. The interval between the D and Eb notes is one semitone and the frequency gap between peak 1331 and 1333 corresponds to a semitone. The frequency gaps between the peaks of the signal processing correspond to the tone and semitone intervals of the notes of the scale.

The spacing pattern of the peaks within the window depends on the scale (i.e. the pattern of intervals between the notes of the scale) and repeats through the octaves covered by the window.

Figure 14:
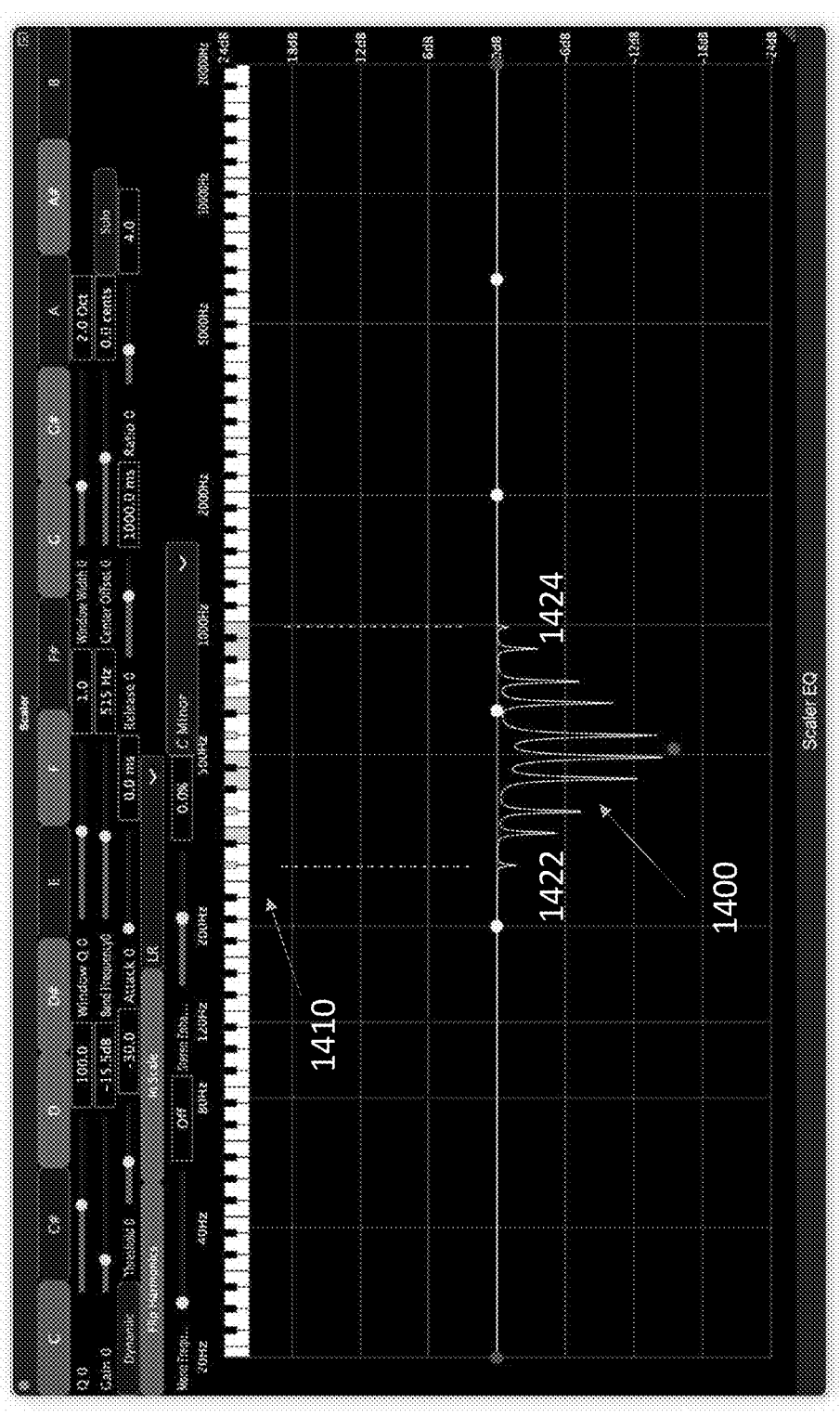
FIG. 14 shows a digital representation of an example of an audio processing function to be applied to an input signal.

FIG. 14 shows a cutting function which removes out-of-key frequencies of the C minor scale. The out-of-key notes of the C minor scale are C# E F# A B. The signal processing function applies negative gains to the frequencies of the audio signal within the window. In the signal processing function of FIG. 14 the frequencies of the out-of-key notes of the C minor scale are cut preferentially compared with other frequencies within the frequency range of the window, as represented by the peaks of the signal processing function.

The window of the signal processing function of FIG. 14 extends includes C# and the B note, covering two full octaves. The peaks are positioned at the frequencies of the out-of-key notes of the C minor scale within the frequency range. The keyboard is displayed above the frequency axis and the out-of-key notes of the C minor key are highlighted. The peaks of audio processing function 1410 appear below the corresponding notes of the keyboard. For example, the peak 1431 has the lowest frequency of the peaks within the window and appears at the frequency of the note C#/Db. The peak 1432 has the highest frequency within the window and appears at the frequency of the note B in the octave above. Between peak 1431 and 1432, eight further peaks appear at frequencies corresponding to the eight out-of-key notes of C minor scale between the C# and the B note in the octave above.

As described above, the peaks in gain are at frequencies corresponding to the out-of-key notes of the scale C minor. In the cutting function, the pattern of the peaks of the signal processing function is determined by the frequency gaps between adjacent out-of-key notes of the scale and represent the intervals between those out-of-key notes. For example, peak gain 1431 is at the frequency of note C#/Db and adjacent peak gain 1433 is at the frequency of note E in the upward direction. The interval between the C# and E notes is three semitones and the frequency gap between peak 1431 and 1433 corresponds to three semitones.

The spacing pattern of the peaks within the window depends on the scale (i.e. the pattern of intervals between the notes of the scale) and repeats through the octaves covered by the window.

In the signal processing functions described with respect to FIGS. 5 to 14, the boost functions have been applied to frequencies of in-key notes and the cut functions have been applied to frequencies of out-of-key notes. In other example signal processing functions, the amplitudes of frequencies of out-of-key notes may be boosted and/or the amplitudes of frequencies of in-key notes may be cut. Cutting the amplitude of in-key frequencies produces a different effect to the audio signal compared with cutting the amplitude of out-of-key frequencies. Boosting the amplitude of out-of-key frequencies produces a different effect to the audio signal compared with boosting the amplitude of in-key frequencies. These different functions may be applied to frequency ranges of the audio signal depending on the desired effect. These signal processing functions all adjust the audio signal based on key and scale but generate different effects. In some cases, music producers may select a key and scale which is different from the key and scale of the composition, to produce a desired sound.

Some example systems include a setting to automatically flip from in-key gain to out-of-key gain depending on whether the gain is positive (boost) or negative (cut). This setting may be referred to as a 'flip harmonics' function. This setting may be set for a particular window function having a particular key and scale. If a user sets the flip harmonics function to an in-key boost setting then if the user changes the amplitude of the window function from boost to cut, the system automatically switches to out-of-key note frequencies in for the cutting function. So for a window function if the user changes the gain from positive to negative (or from negative to positive) the function swaps from in-key note frequencies to out-of-key note frequencies. The flip harmonics function can be applied to in-key boost (and so out-of-key cut) and/or out-of-key boost (and so in-key cut). This automatic change between in-key and out-of-key for different amplitude polarities can be useful in music production. For example a music producer can use the in-key boost function identify the in-key notes of the track, by increasing the amplitude of the in-key notes these become louder in the audio signal and easier to hear. Once these are identified, the user can simply change the polarity of the amplitude (i.e. swap the boost function to a cut function) and the system automatically swaps to an out-of-key cut function. The out-of-key cut function reduces the amplitude of the out-of-key frequencies in the audio signal to make them less prominent. The flip harmonics feature can also be also be used to swap from between an out-of-key boost and an in-key cut.

The functions produced by the system and shown in FIGS. 13 and 14 are an example of when the flip harmonics function is activated, automatically swapping from boosting the in-key note frequencies of C minor (FIG. 13) to cutting the out-of-key note frequencies of C minor (FIG. 14) when the user swaps the amplitude (gain) from positive to negative.

If the flip harmonics is not activated then changing the polarity of the gain of the function does not change the notes which are boosted or cut. For example if an in-key boost function is swapped to a cut, then the cut function is an in-key cut function.

Figure 15:
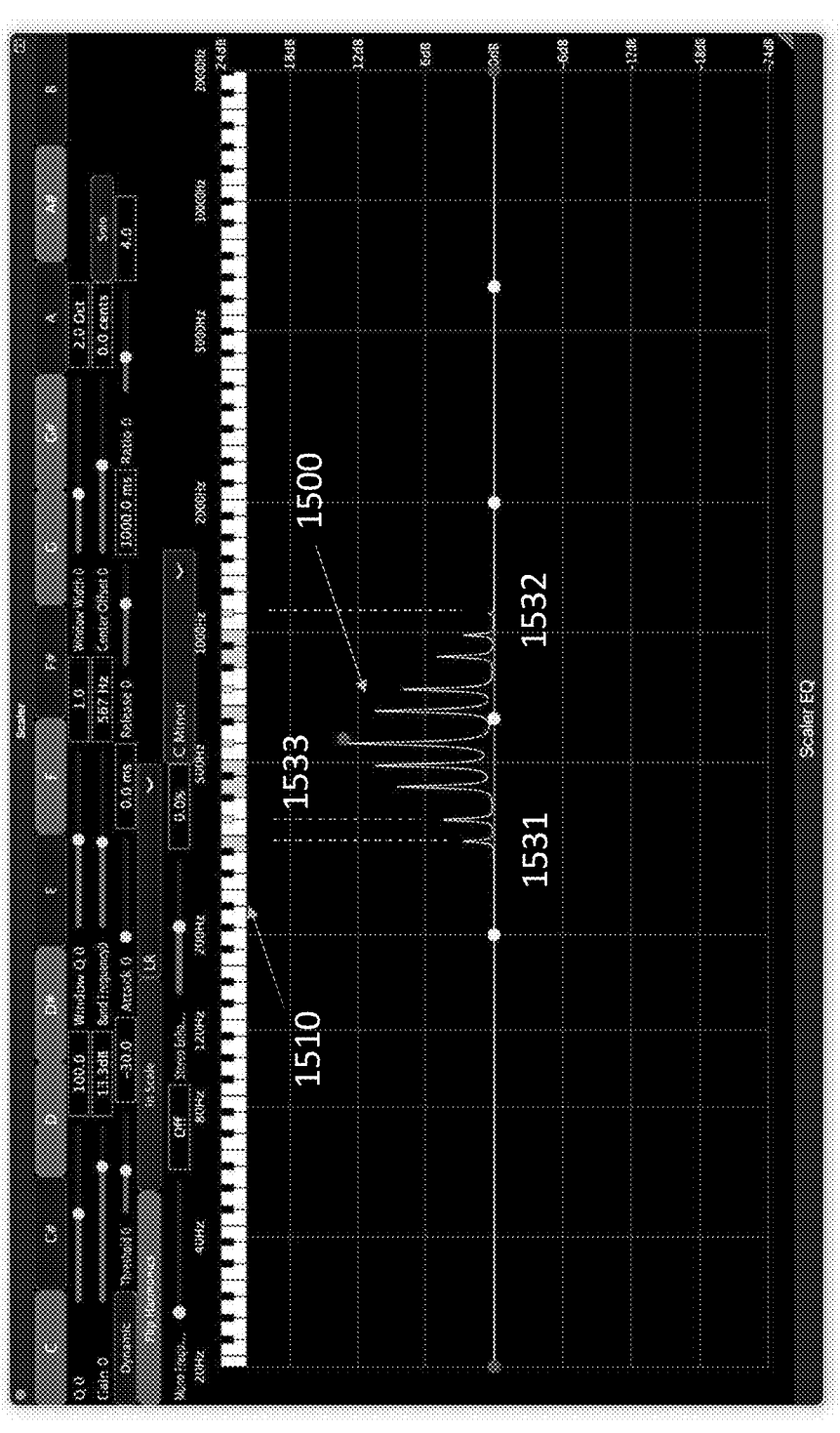
FIG. 15 shows a digital representation of an example of an audio processing function to be applied to an input signal.
Figure 16:
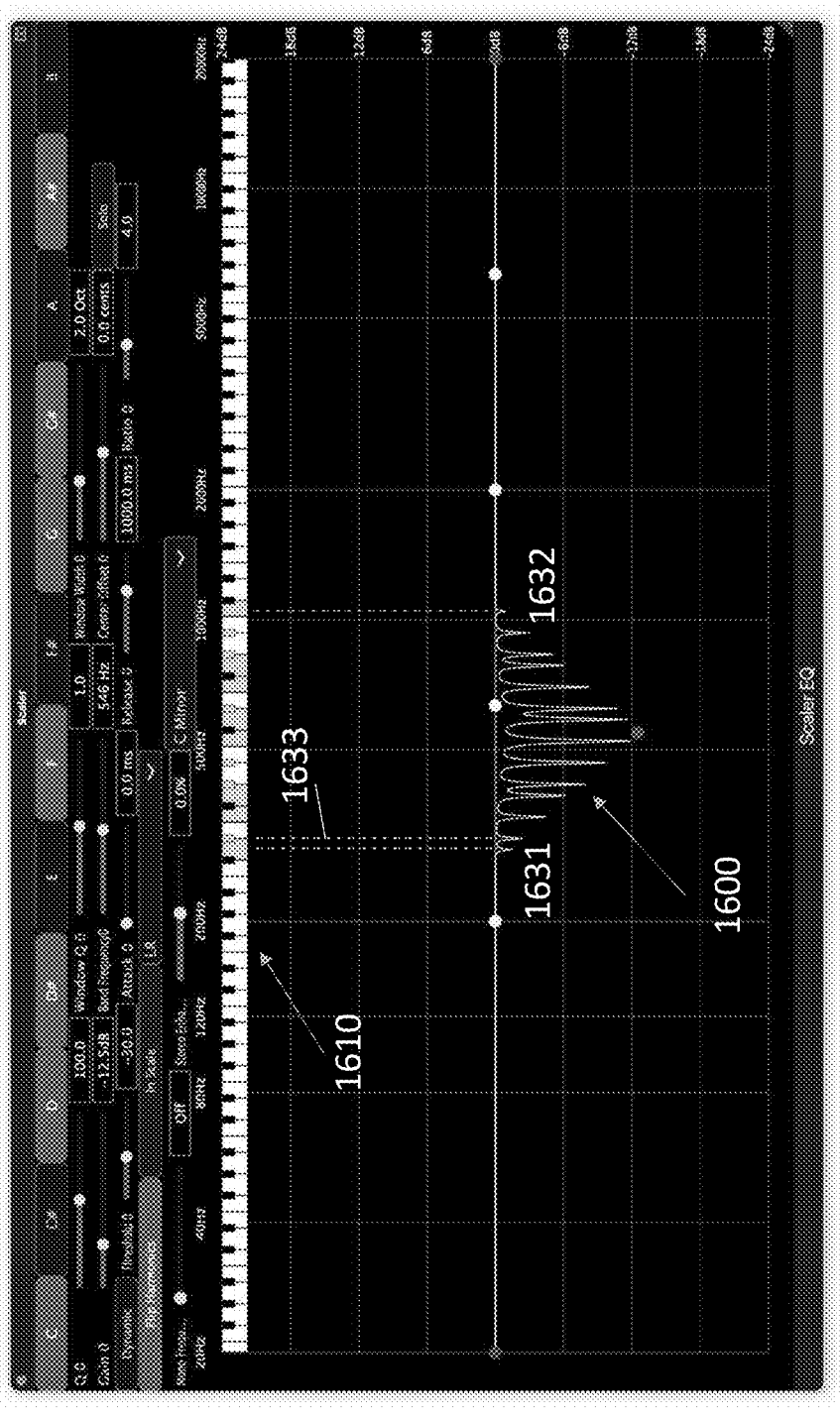
FIG. 16 shows a digital representation of an example of an audio processing function to be applied to an input signal.

FIG. 15 provides an example of a signal processing function which is configured to preferentially boost the amplitude of out-of-key frequencies and FIG. 16 provides an example of a signal processing function which is configured to preferentially cut the amplitude of in-key frequencies.

Referring to FIG. 15, audio processing function 1500 is shown represented on a frequency axis (Y-axis) covering frequencies between of 20 Hz to 20,000 Hz and on a gain axis (X-axis) covering gain between +24 dB to −24 dB. An animation of a keyboard 1510 is illustrated in FIG. 15, and the notes of the keyboard are displayed above the frequency axis at a position corresponding to their frequency. The dashed lines of FIG. 15 are shown for clarity only and do not form part of the function.

Audio processing function 1500 has a bandwidth which defines the frequency range over which it processes an input audio signal. The centre frequency of the signal processing function of FIG. 15 is the same as that as FIG. 13 (567 Hz). The audio processing function 1510 applies a positive gain (boost) to selective frequencies within the frequency range. The audio processing function of FIG. 15 is tuned to the key of C minor. The C minor scale includes the notes C D Eb F G Ab Bb. So for the C minor scale the in-key notes are C D Eb F G Ab Bb. The out-of-key notes are C# E F# A B.

In the example of FIG. 15, the window includes notes from D in the mid-range to C#, covering two full octaves. The signal processing function adjusts frequencies within the frequency window based on the C minor scale.

The signal processing function shown in FIG. 15 is configured to boost the out-of-key frequencies of the C minor scale within the window in preference to other frequencies. Within the window, the signal processing function 1500 includes a series of peaks, the higher the peak, the greater the gain applied to that frequency of an input signal. The peaks are positioned at the frequencies of the out-of-key notes of the C minor key and scale. Again, this is illustrated by the peaks appearing below the corresponding notes of the keyboard. For example, the peak 1531 has the lowest frequency of the peaks within the window and appears at the frequency of the note E. The peak 1532 has the highest frequency within the window and appears at the frequency of the note C#. Between peak 1531 and 1532, eight further peaks appear corresponding to the eight out-of-key notes of the C minor scale between the E and C# notes across the two octaves of the window.

The pattern of the out-of-key peaks which correspond to the out-of-key notes of the C minor scale shown in FIG. 15 can be contrasted with the pattern of the in-key peaks of the C minor scale shown in FIG. 13 which correspond to different notes.

The frequency gaps between the peaks are the frequency gaps between adjacent out-of-key notes of the scale and represent the intervals between the notes. For example, peak 1531 is at the frequency of note E and adjacent peak 1533 is at the frequency of note F# in the upward direction. The interval between the E and F# notes is one tone and the frequency gap between peak 1531 and 1533 corresponds to a tone. The frequency gaps between the peaks of the signal processing correspond to the intervals between the out-of-key notes of the scale.

Audio processing functions which boost out-of-key note frequencies are useful in identifying unwanted notes during the audio production process. By boosting the amplitude of the out-of-key note frequencies, if the audio signal includes any out-of-key notes, those notes become louder in the audio signal and so easier to hear (and more prominent). Once the-out-of key note is identified, the producer can then swap the out-of-key boost function to an out-of-key cut function to remove or reduce the amplitude of that note in the audio signal. Out-of-key notes may be present in the audio signal for many reasons, for example the out-of-key note may have been played or sung, the out-of-key note may have been picked up in background noise in the microphone signal, or it may have been picked up in interference or other sound source.

FIG. 16 shows a cutting function which applies a negative gain (cut) to in-key frequencies of the C minor scale. The in-key notes of the C minor scale are C D Eb F G Ab Bb. The signal processing function applies negative gains to the frequencies of the audio signal within the window. In the signal processing function of FIG. 16 the frequencies of the in-key notes of the C minor scale appearing in an input signal are cut preferentially compared with other frequencies of the input signal within the frequency range of the window, as represented by the peaks of the signal processing function.

The window of the signal processing function of FIG. 16 extends between D and the C notes, covering two full octaves. The peaks are positioned at the frequencies of in-key-notes of the C minor scale within the frequency range. The keyboard is displayed above the frequency axis and the in-key notes of the C minor scale are highlighted. The peaks of audio processing function 1610 appear below the corresponding notes of the keyboard. For example, the peak 1631 has the lowest frequency of the peaks within the window and appears at the frequency of the note D. The peak 1632 has the highest frequency within the window and appears at the frequency of the note C in the octave above. Between peak 1631 and 1632, twelve further peaks appear at frequencies corresponding to the twelve in-key notes of the C minor scale between the D and C note in the in the octave above.

As described above, the peaks in the gain function are at frequencies corresponding to the in-key notes of the C minor scale. In the cutting function, the pattern of the peaks of the signal processing function is determined by the frequency gaps between adjacent in-key notes of the scale and represent the intervals between those in-key notes. For example, peak 1631 is at the frequency of note D and adjacent peak 1633 is at the frequency of note Eb in the upward direction. The interval between the D and Eb notes is one semitone and the frequency gap between peak 1631 and 1633 corresponds to one semitone.

There are several main features of the signal processing function. Each one of these features is determined by a separate function, and some or all of the features are combined to produce the signal processing function.

One feature is the position of the peaks (i.e. the highest gain multipliers) within the window, as discussed above the position of the peaks is dependent on key and scale.

Another feature is the overall shape (silhouette) of the signal processing function within the window. This feature may be defined by a specific function, referred as the window shape function.

Another feature is the shape of the individual peaks within the function. This feature may be defined by a specific function, referred to as the peak shape function.

Some or all of these functions are combined to produce the signal processing function which then defines the amplitude adjustment (gain) applied to frequencies of an input audio signal.

Figure 17:
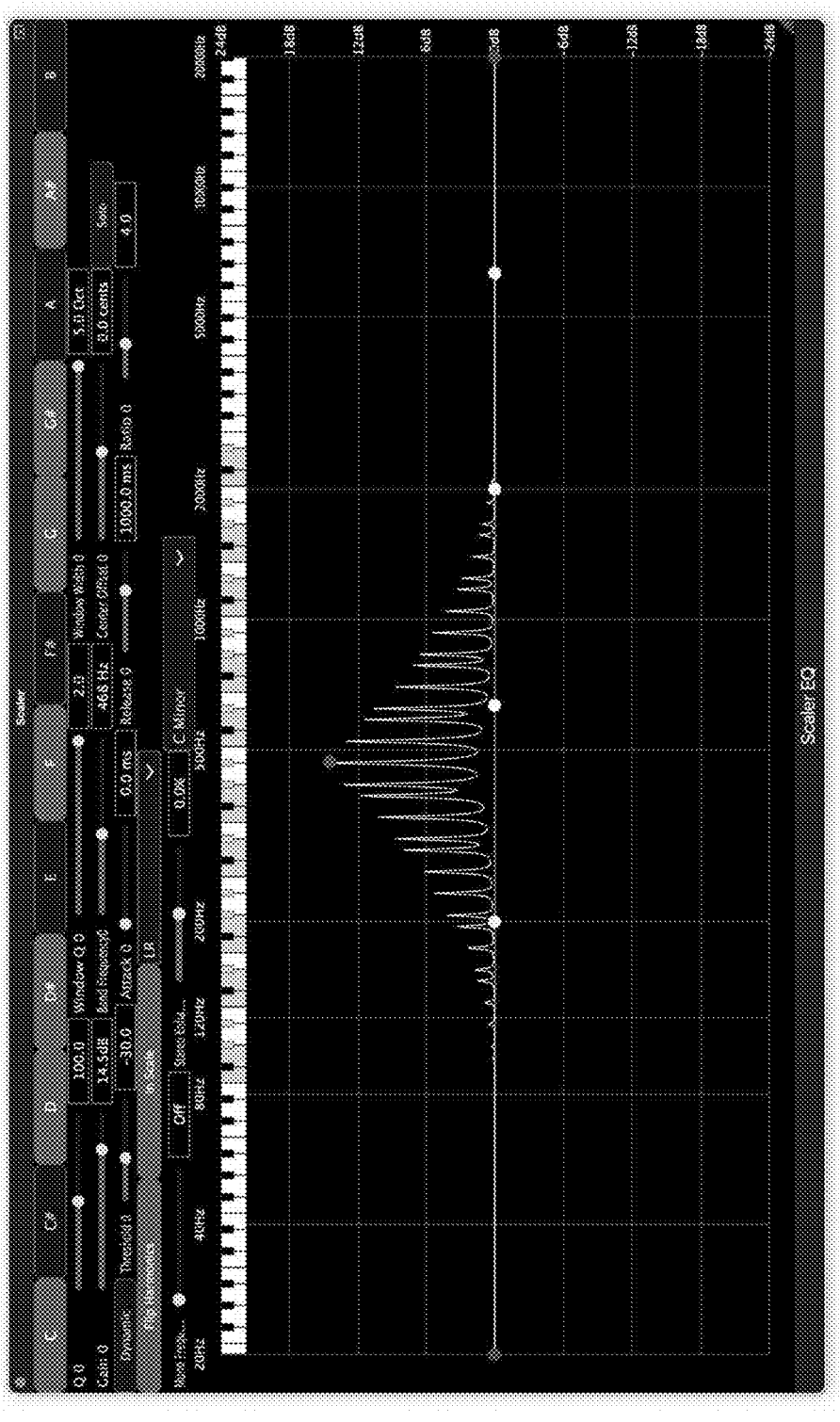
FIG. 17 shows a digital representation of an example of an audio processing function to be applied to an input signal.
Figure 18:
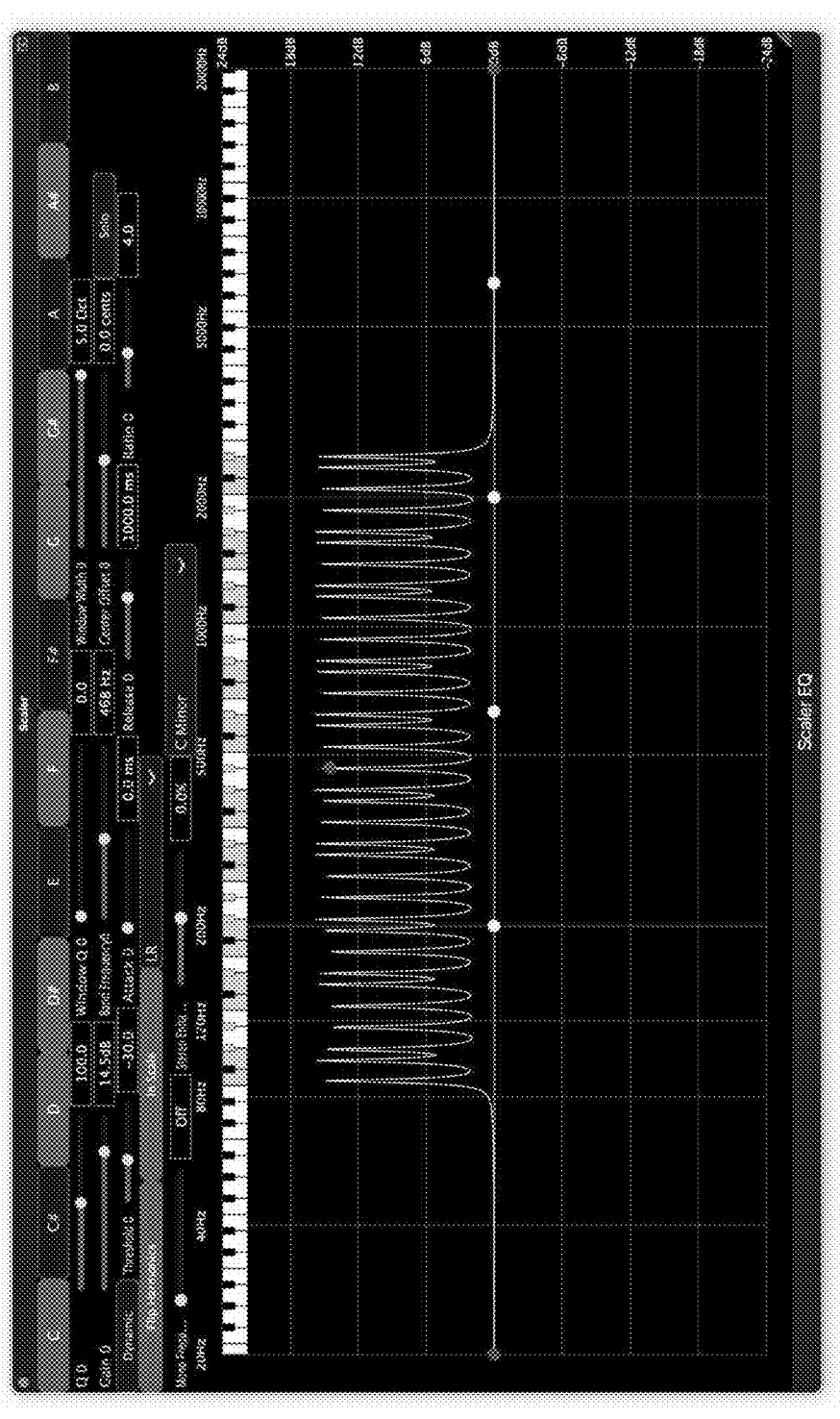
FIG. 18 shows a digital representation of an example of an audio processing function to be applied to an input signal.

The feature of the overall shape (silhouette) of the signal processing function is now described with respect to FIGS. 17 and 18. FIG. 17 shows a boosting function set to the key of C minor. The overall shape (silhouette) of the signal processing function within the window is a bell curve. The window shape function of the signal processing function of FIG. 17 is a bell curve.

The window shape function defines the amplitude adjustment (gain) applied to frequencies within the window. This gain is with respect to a maximum gain for the window shape function. In the example of the signal processing function of FIG. 17, the maximum gain is applied to the centre frequency of the window and the window shape function is symmetrical about the centre frequency. The gain applied to each frequency is reduced as the frequency moves away from the centre frequency.

Contrasting window shape functions are shown in FIGS. 17 and 18. The signal processing function of FIG. 17 is a boost function set to boost the in-key notes of the C minor scale, has a centre frequency of 468 Hz and extends between the F note to the Eb note and covers five full octaves. The signal processing function of FIG. 18 is also a boost function set to boost the in-key notes of the C minor scale, has the same centre frequency as FIG. 17 of 468 Hz and extends between the same F note to the Eb note and covers the same five full octaves as the signal processing function of FIG. 17.

The difference between the signal processing function of FIG. 17 and the signal processing function of FIG. 18 is the shape of the function. In the signal processing function of FIG. 17, the window function follows a bell curve and the gain applied to the frequencies is dependent on the distance from the centre frequency. This bell curve shape is similar to that of a traditional EQ system. In the signal processing function of FIG. 18, the window function applies a more consistent gain to the frequencies across the window.

In FIG. 17 the window shape function is a bell curve. In FIG. 18 the window shape function defines a more consistent gain applied to the selected frequencies across the window. In the example of FIG. 18, the frequencies of all in-key notes of the C minor scale within the frequency range of the function are amplified by similar amounts (i.e. similar gain is applied to all in-key frequencies within the range). In contrast, in the signal processing function of FIG. 17, the amplification of in-key notes of the C minor scale within the frequency range of the window varies depending on the position of the frequency within the within the window and compared with the centre frequency.

The window shape function of FIG. 17 and FIG. 18 may be a bell curve having a Q parameter. The Q parameter of the function of FIG. 17 is greater than the bell curve of the function of FIG. 18, producing a more pronounced bell curve within the frequency window.

In both the signal processing functions of FIG. 17 and FIG. 18 the gain is applied to the in-key frequencies. As described above, the frequencies to which the gain is applied depends on the key and scale settings for the window.

In further examples, the window shape function may be configured to define a different shape. For example, the Q parameter of the bell curve may be variable. In other examples, the shape may not be a bell curve. In further examples the shape may not be symmetrical about the centre frequency of the selected frequency range.

The peak shape function contributes to the shape of the signal processing function. In the examples of the signal processing functions of FIGS. 5 to 18, the peak shape function which defines the shape of the gain peaks is a bell curve with a maximum centre frequency of the note frequency. The peak shape function for a note frequency is defined by a Q value and the gain. The gain for a frequency is defined by the window shape function. The maximum gain of the peak is at the note frequency. The Q value of peak shape function applied to the selected frequencies within the window may be selected by a user via the user interface. The same peak shape function may be applied to all relevant key and scale frequencies within the selected frequency window, so each peak shape function has the same Q value. Alternatively, the Q value for each frequency may be individually selected.

Figure 19:
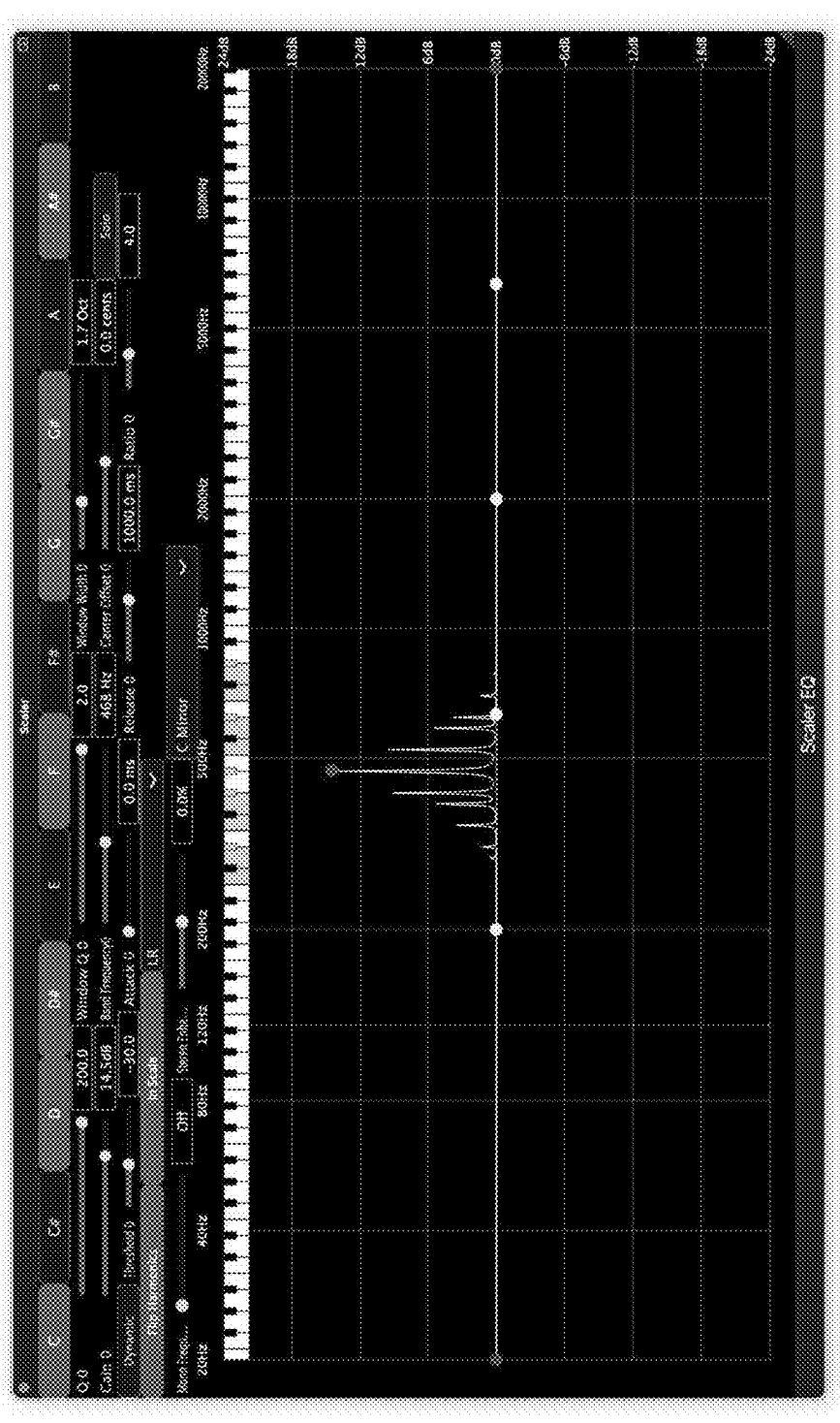
FIG. 19 shows a digital representation of an example of an audio processing function to be applied to an input signal.

High Q values produce a sharp peak. A sharp peak provides a very specific frequency response which applies the maximum gain to the in-key frequency but the gain drops off sharply across frequencies away from the centre frequencies. FIG. 19 shows a frequency range in which a high Q value is applied to the peak shape functions of the note frequencies. The high Q value produces sharp peaks in gain and so gain is applied primarily to the note frequency. This produces a very specific response. This can produce a focused resonating effect because it is a narrow range and can be good for finding specific sounds or resonances that the users don't like.

Figure 20:
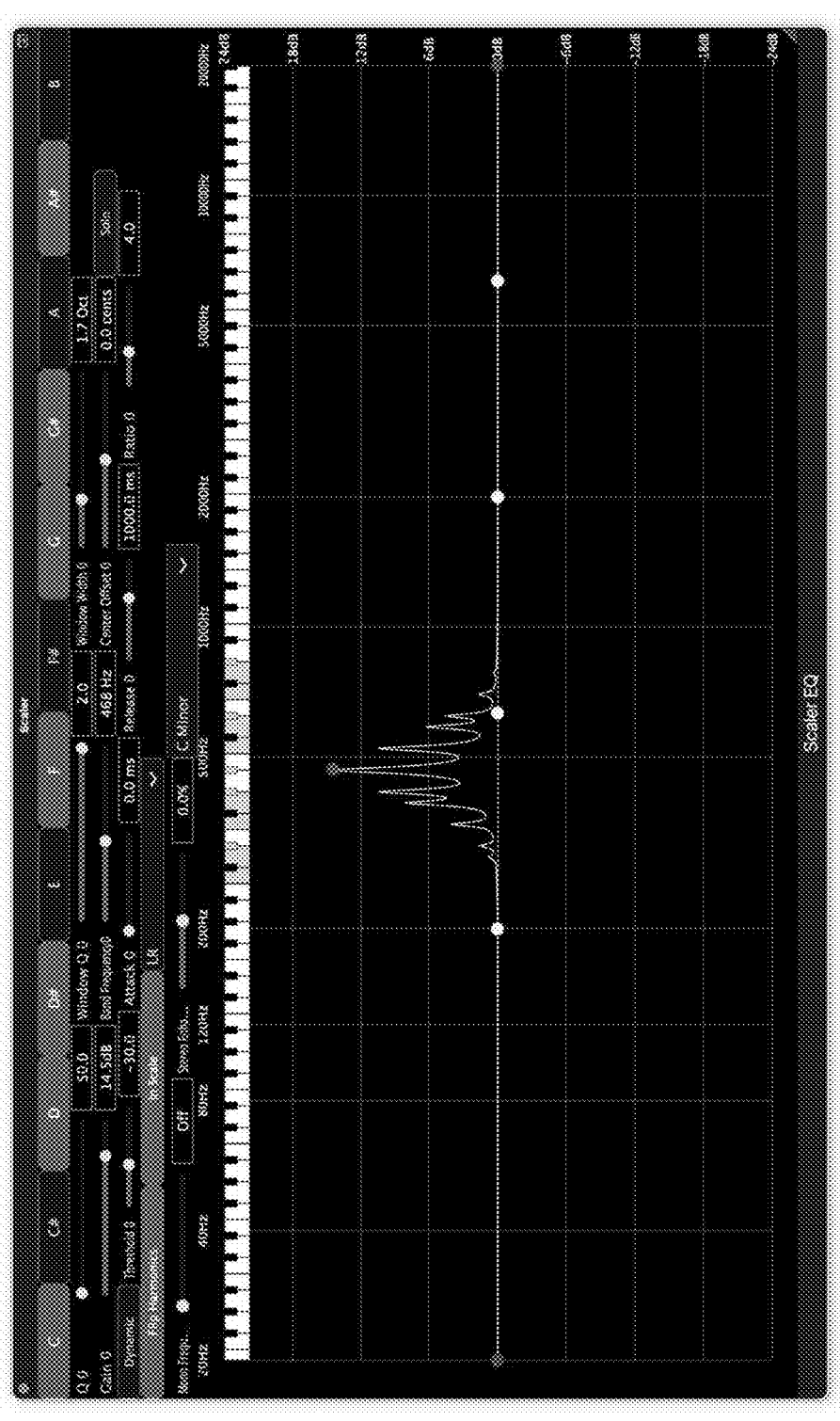
FIG. 20 shows a digital representation of an example of an audio processing function to be applied to an input signal.

FIG. 20 shows a signal processing function in which the peak shape function has a lower Q parameter applied to the note frequencies within the window. The lower Q value provides a wider frequency response between the peaks. The peaks of the boosted notes becomes less sharp and the sides of the curve become shallower. This applies the maximum gain at the note frequency but provides a broader frequency response, i.e. the affects a wider frequency range away from the centre frequency of the peak, as the gain applied to frequencies away from the peak is greater than that of the higher Q setting. The shallower peaks produced by the lower Q parameters result in a higher gain being applied to the frequencies between the note frequencies. The overall effect is a less specific response.

Figure 21:
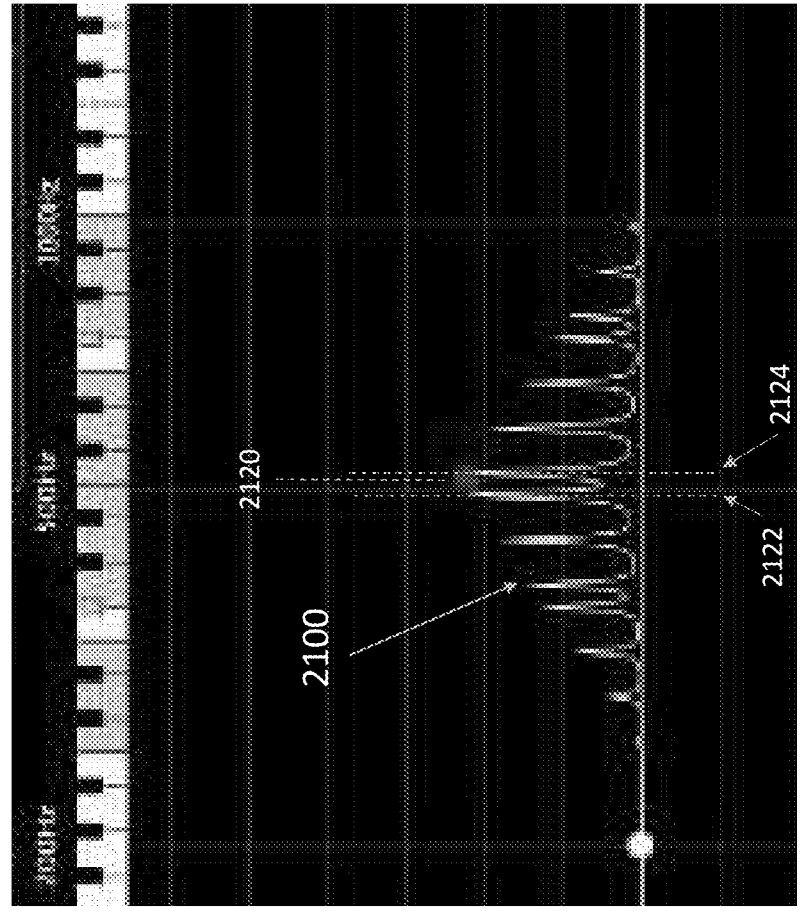
FIG. 21 shows a digital representation of an example of an audio processing function to be applied to an input signal.

The maximum gain of the window function is set for the centre frequency. In the example of FIG. 21 the centre frequency is not locked to the in-key of out-of-key notes and can be set at any frequency. When the centre frequency coincides with an in-key or out-of-key frequency, then the gain for that in-key or out-of-key frequency is the gain of the centre frequency of the window function. But if the centre frequency of the window function does not coincide with an in-key or out of key frequency then the gain applied to the note frequencies is dependent on the gain of the window shape function at that frequency and so may be below the maximum gain for the window. This can be seen in FIG. 21. FIG. 21 again shows a boosting function set to the key of G major. In the signal processing function of FIG. 21, the centre frequency of the function 2120 is set between in-key frequencies. Centre frequency 2120 is positioned between the frequencies of the in-key notes of B 2122 and C 2124. The peak gains of in-key notes B 2122 and C 2124 are less than the maximum gain of the signal processing function at the centre frequency 2120 (however, since the centre frequency is not an in-key note frequency, the gain of the function is not applied to the centre frequency).

Multiple signal processing functions can be applied across a frequency range. The combination of these multiple signal processing functions is applied to the input signal.

Figure 22:
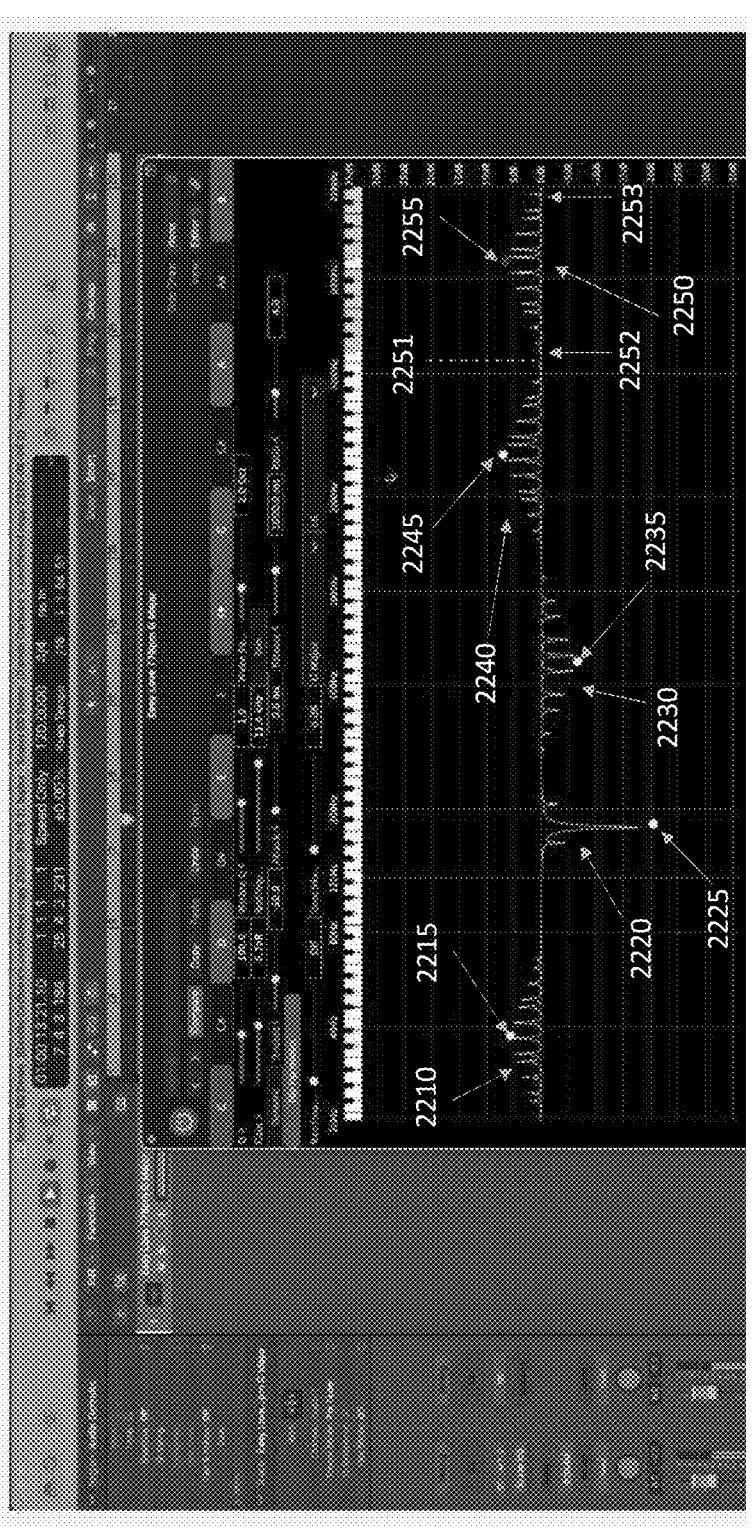
FIG. 22 shows a digital representation of an example of an audio processing function to be applied to an input signal.

FIG. 22 shows five separate windows 2210 2220 2230 2240 2250 within the frequency range 20 Hz to 20,000 Hz. The windows may be positioned at different frequencies covering low frequencies, high frequencies or the mid-range. The parameters for each window function may be set independently, including: Q parameter, bandwidth, centre frequency, gain, key, etc. This provides the system, and the user, with flexibility in setting the window functions.

In the example of FIG. 22 the window functions are all set to the key of G major, but separate keys may be selected for each window function. Window functions 2210 2240 2250 are boosting functions. Window functions 2220 2230 are cutting functions. For each window function, the centre frequency is indicated within the figure, the centre frequency may be indicated by a graphical icon on a graphical user interface, 2215 for window function 2210, 2215 for window function 2220, 2235 for window function 2230, 2245 for window function 2240, 2255 for window function 2250.

For example for window function 2250, the bandwidth extends between frequency 2251 and 20,000 kHz. The in-key notes of the keyboard within the window function 2250 are highlighted. The lowest frequency in-key peak within window 2250 is the frequency corresponding to the F# note (highlighted) at 2252. The highest frequency in-key peak within window 2250 is the frequency 2253 corresponding to the D note.

Window function 2220 has the highest gain of all the window functions of FIG. 22. Window function 2220 also has the narrowest bandwidth and includes only frequencies corresponding to three out-of-key notes. The relatively high Q value of window function 2220 produces a sharp peak in the window function.

The frequency ranges of the window functions of FIG. 22 do not overlap. This means each window function is applied to a separate frequency range.

As mentioned above, the parameters for each window function may be set independently. For example, separate window functions may be set to different keys, for example a first window function across a first frequency range may be set to G major and a second window function across a second frequency range may be set to C major. Other parameters of the functions may also be different, for example the G major window function may be set to boost in-key note frequencies, and the C major window function may be set to boost out-of-key note frequencies. Other parameters including bandwidth, Q parameter for the window function, peak shape, in-key/out-of-key boost or cut, flip harmonics functionality, gain level may also be set independently. This flexibility provides music producers or other users with full control of how the amplitudes of different frequencies of an input audio signal are adjusted in order to change the sound.

In some examples the frequency ranges of the window functions overlap. In cases where frequency ranges overlap, the overall gain applied to a frequency in the overlapping frequency range is a combination of the gain for that frequency from each function.

Figure 23:
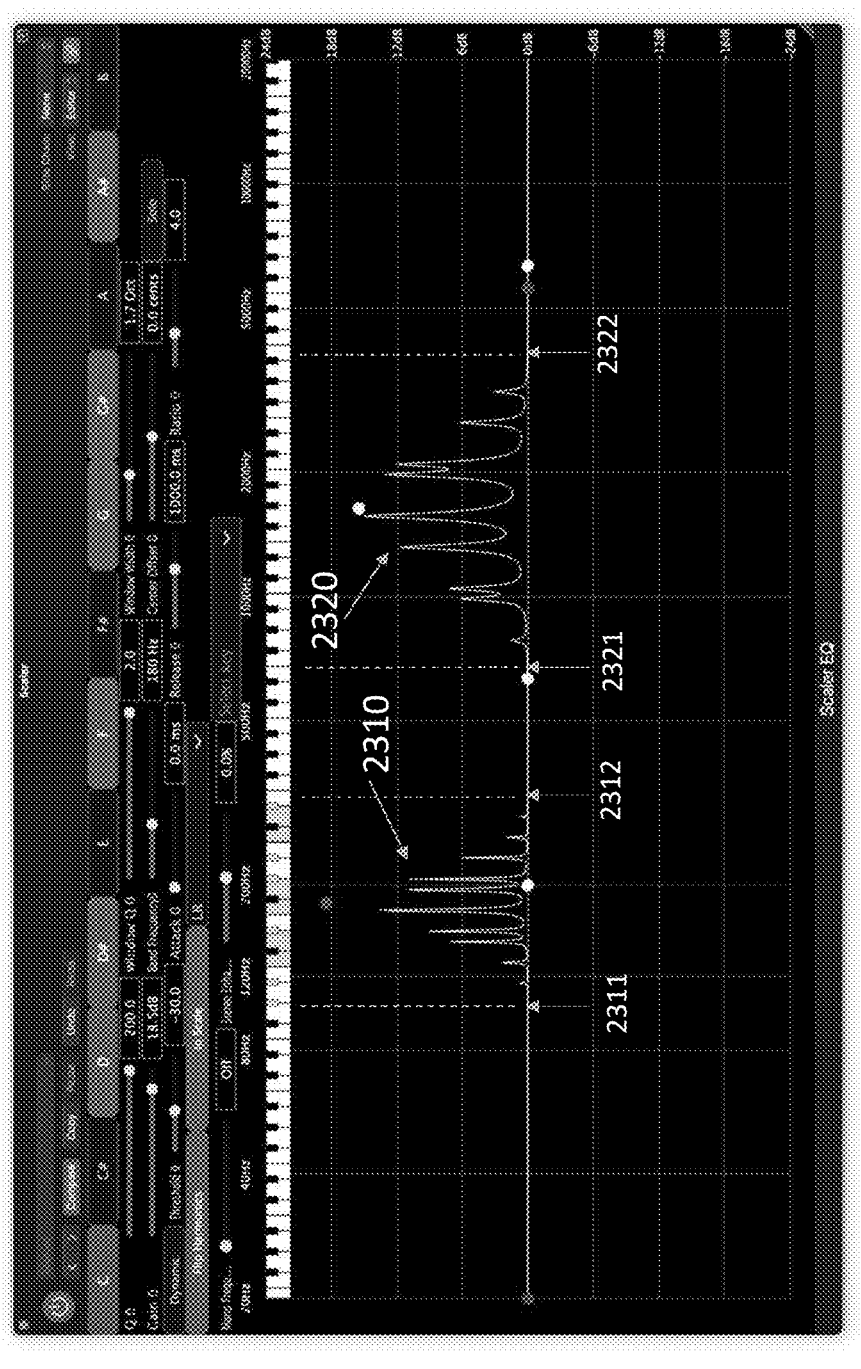
FIG. 23 shows a digital representation of an example of an audio processing function to be applied to an input signal.
Figure 24:
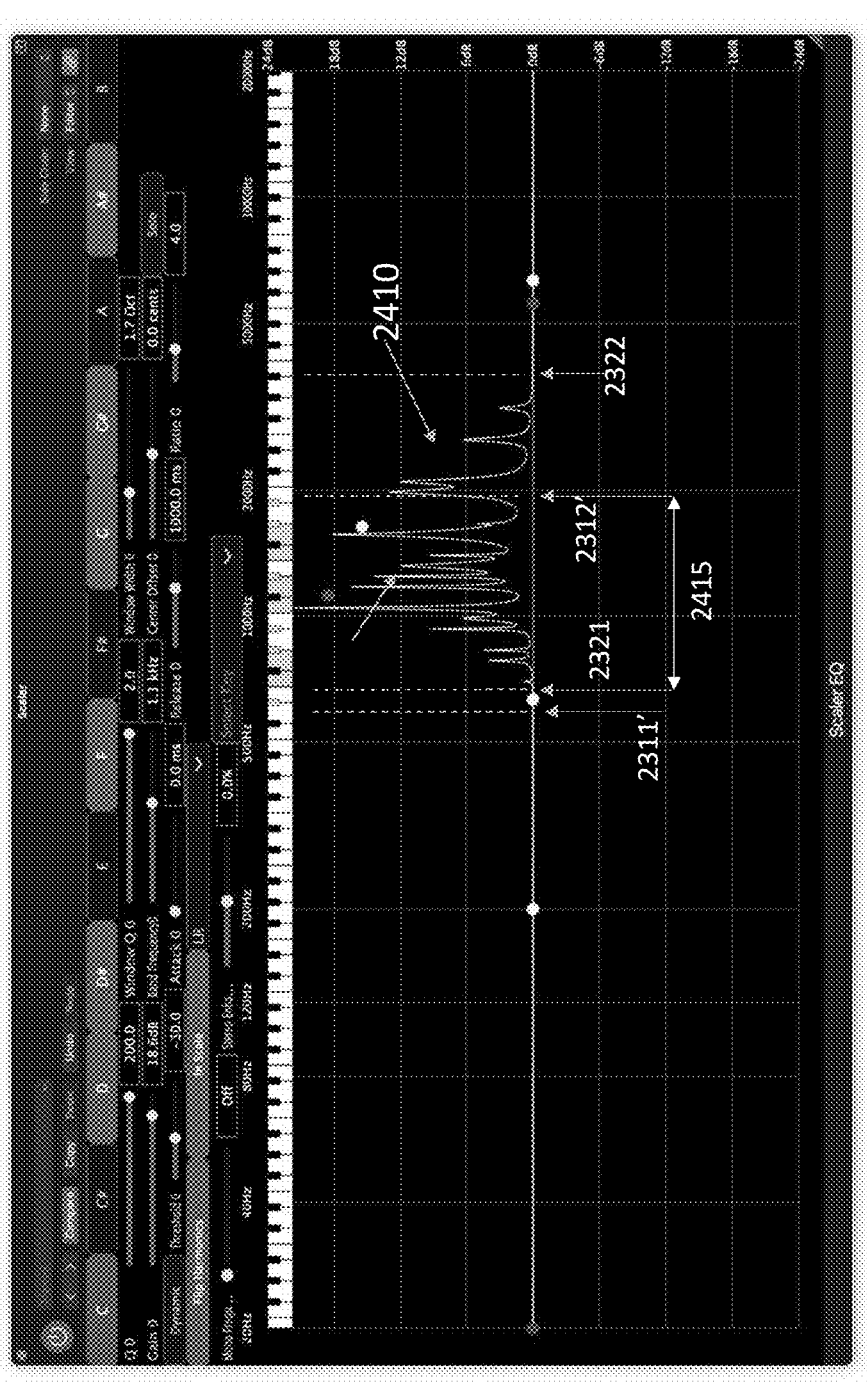
FIG. 24 shows a digital representation of an example of an audio processing function to be applied to an input signal.

FIGS. 23 and 24 include two signal processing functions. In FIG. 23 the signal processing functions have separate frequency ranges and do not overlap. In FIG. 24 the frequency ranges partially overlap.

Referring now to FIG. 23. FIG. 23 includes two signal processing functions a first signal processing function 2310 and a second signal processing function 2320. First signal processing function 2310 is a boosting function extending between the frequencies indicated by 2311 (at a frequency around the G note) and 2312 at a frequency around the frequency of the E key in the octave above. Signal processing function 2320 is a boosting function extending between the frequencies indicated by 2321 (at a frequency around the E note) and 2322 (at a frequency around the frequency of the B note in the third octave above). The frequency ranges of the signal processing functions 2310 and 2320 do not overlap.

In FIG. 24 the same two signal processing functions from FIG. 23 are created but signal processing function 2310 has been moved up the frequency range (i.e. to the right) and now partially overlaps with signal processing function 2320 from FIG. 23. The resulting signal processing function 2410 is a combination of signal processing functions 2310 and 2320 from FIG. 23. Signal processing function 2320 from FIG. 23 is unchanged. It is a boosting function extending between the frequencies indicated by 2321 (at a frequency around the E note) and 2322 (at a frequency around the frequency of the B note in the third octave above). The notes of the keyboard relevant for signal processing function 2320 are not highlighted. Signal processing function 2310 is a boosting function. The width, gain and other parameters of signal processing function are maintained (from the signal processing function 2310 of FIG. 23) but it has been moved to a higher frequency range. The function is 2310' and now extends between the frequencies indicated by 2311' (at a frequency around the D note) and 2312' at a frequency around the frequency of the B key in the octave above.

The signal frequency functions overlap in the frequency range labelled 2415 extending between the lower end of the function 2320 (2321) and the higher end of function 2310' (2312'). The gain applied to frequencies in the overlapping region 2415 includes a contribution from each function. So for a specific frequency, the gain is a combination of the gain for that frequency from each function. For example, the gain for that frequency may be the sum of the gains for that frequency from each function.

In the example of FIG. 24, two key-and-scale based functions are partially overlapped to produce a combined signal processing function. In other examples, key-and-scale based functions may be overlapped with other signal processing functions to produce combined signal processing functions.

Figure 25:
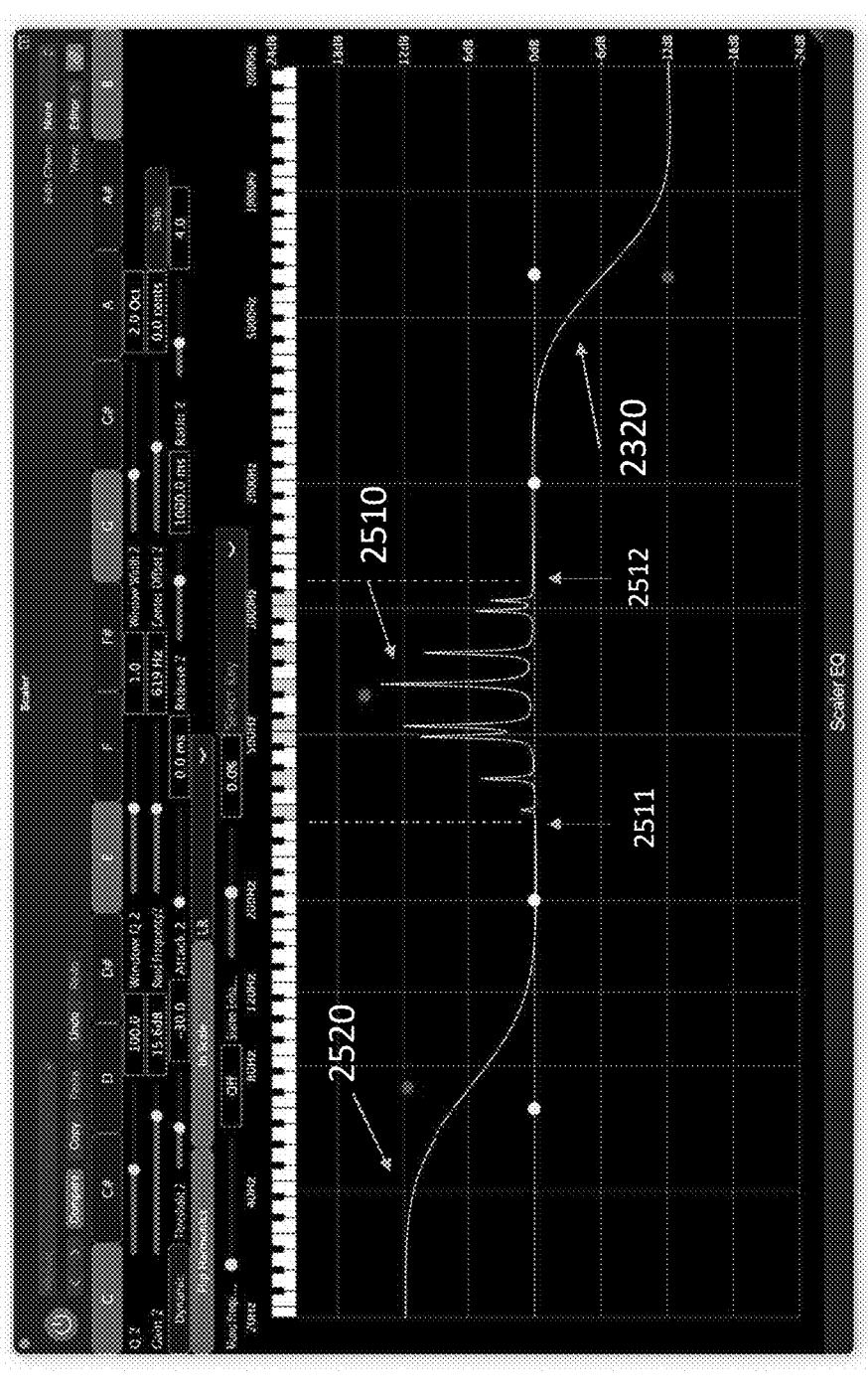
FIG. 25 shows a digital representation of an example of an audio processing function to be applied to an input signal.

FIG. 25 shows three signal processing functions for applying to an audio signal. Signal processing function 2510 is a key-and-scale based boost function positioned in the mid-range of the frequency range and having a frequency range between low frequency 2511 and high frequency 2512. Signal processing function 2520 is a low shelf function. The low shelf function boosts frequencies in the low frequency range of the audio signal (bass). Low shelf function 2520 is a boost function. Signal processing function 2530 is a high shelf function. The high shelf function adjusts the gain of frequencies in the high frequency range of the audio signal (typically, noise). High shelf function 2530 is a cut function and cuts high frequencies form the audio signal. Shelf functions are well known in audio processing operate like high pass filters and low pass filters. The shelf functions 2520 and 2530 are not key-and-scale based functions.

Figure 26:
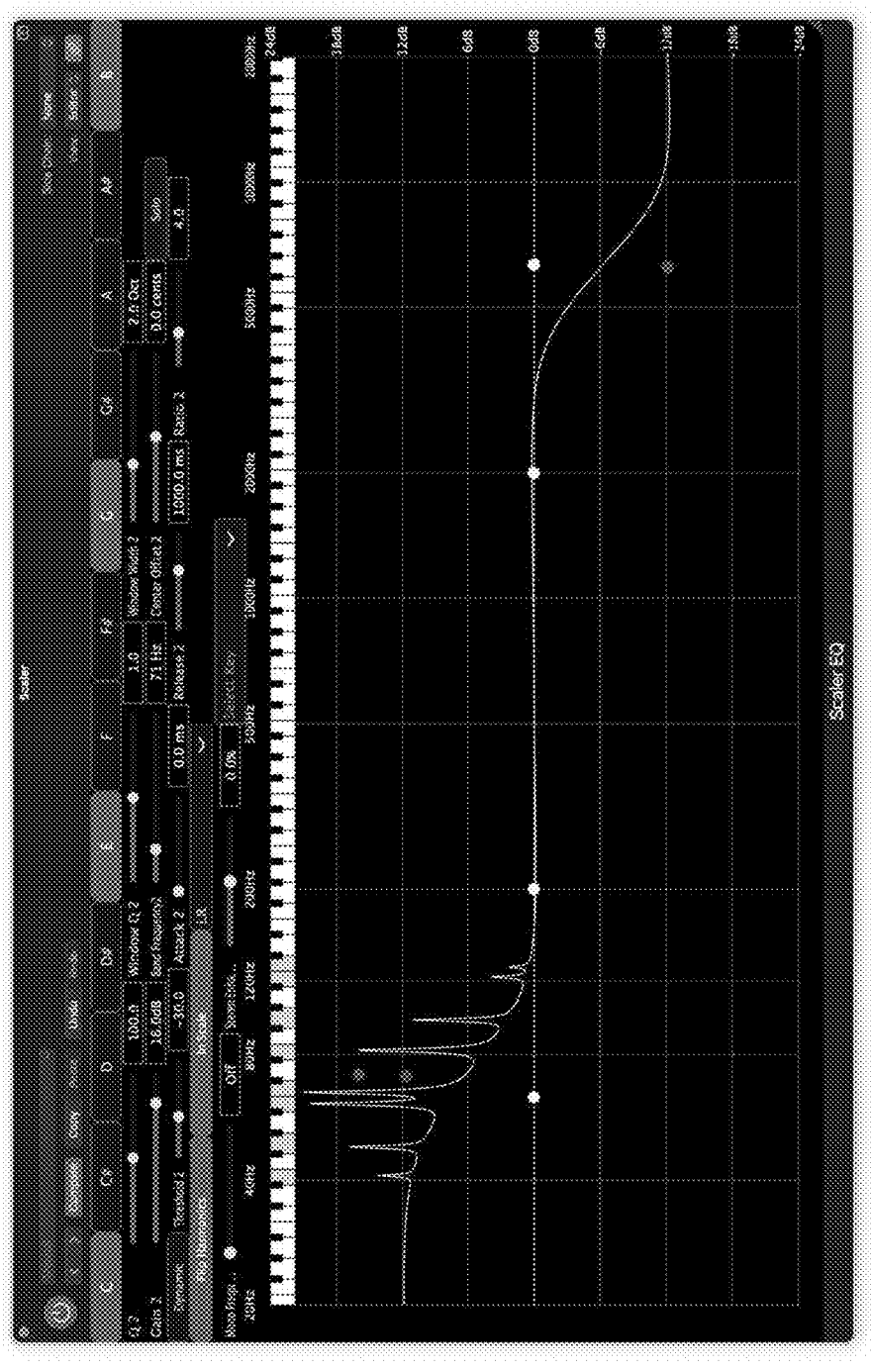
FIG. 26 shows a digital representation of an example of an audio processing function to be applied to an input signal.

In FIG. 26, the same three functions are applied to the input signal but signal processing function 2510 has been moved to a lower frequency band and overlaps with the low shelf function 2520. The gain applied to frequencies in the overlapping region includes a contribution from each function. So for a specific frequency, the gain is a combination of the gain for that frequency from each function. Consequently, the combination function is dependent on key-and-scale.

Figure 27:
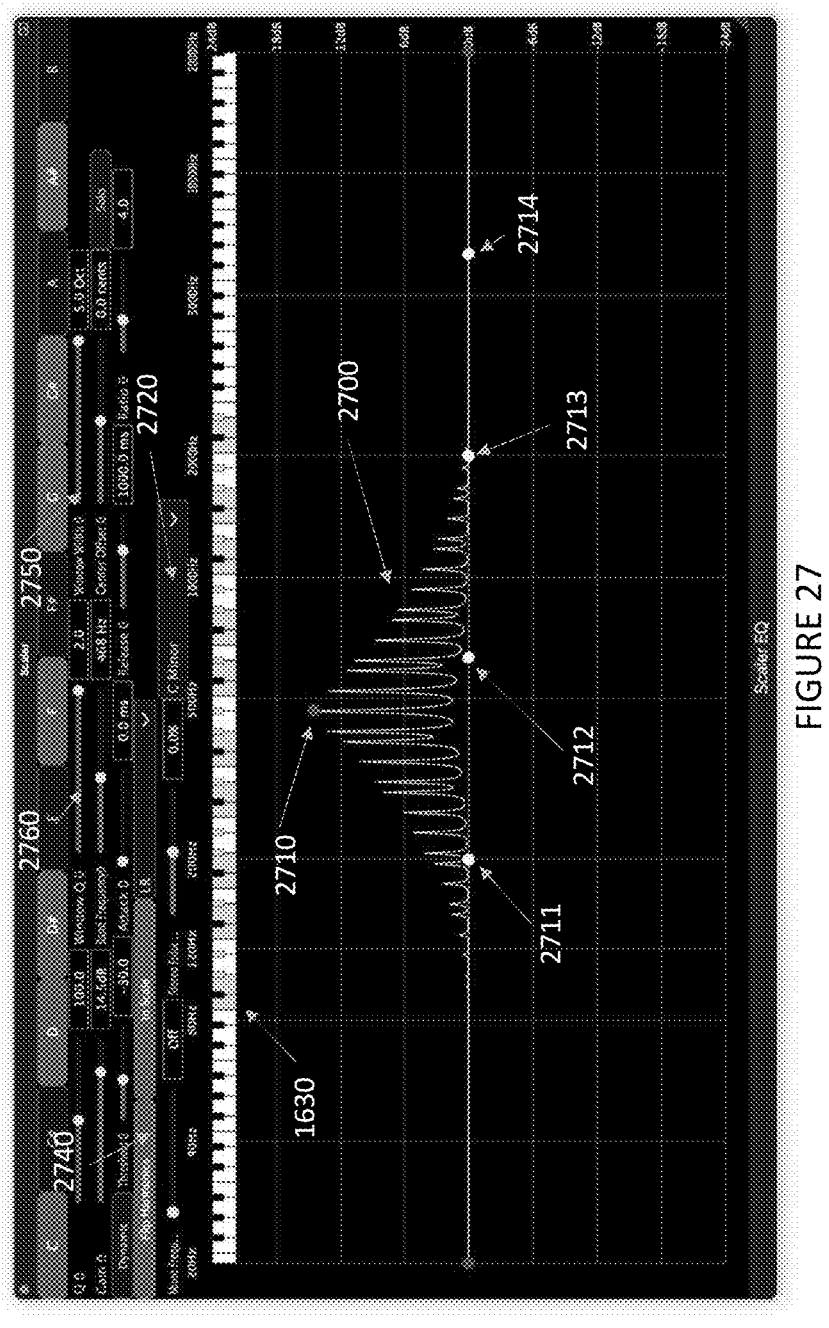
FIG. 27 shows a digital representation of an example of an audio processing function to be applied to an input signal.

The EQ settings can be controlled by a user through user interface 260. FIG. 27 shows an example user interface for controlling the settings for the signal processing function. The interface provides clear control functions and visual feedback, making it easy for users to understand and manipulate the settings. The user interface is typically displayed on a screen 262 and controlled via user input device 264. A typical user input device may include a keyboard and mouse but other user input devices are available and suitable for use with the system.

The user interface displays the frequency range available for signal processing. In the example of FIG. 27 the frequency range extends between 20 Hz to 20,000 Hz. Each available window function is accessed via a window icon. The user interface of FIG. 27 includes five windows identified by window icons 1610 1611 1612 1613 1614. In the example of FIG. 27, window 2700 is active and icon 2710 is highlighted. Windows icons 2711 2712 2713 2714 are inactivate (and no window function is shown for those windows. Window functions may be added or removed as required.

The user interface provides a user with control of the window functions. For an active window, settings for the window can be selected. Key selector 2720 allows a user to select the key and scale to apply to the window function. This locks into and out of the key frequencies. In the example of FIG. 27 the selected key is G major. The key selector may allow selection via, for example, a drop down menu.

Keyboard 2730 is displayed on the user interface. The notes of the keyboard are displayed above the frequency axis at positions corresponding to their frequency. The frequencies may also be displayed. In the example of FIG. 27 the in-key notes of selected key G major appearing within the active window are highlighted. This provides the user with clarity of which notes will be boosted or cut in the window. The window function 2710 is displayed on the frequency range displaying showing the frequency response to be applied to the input signal. As described above, the frequency response function (window function) is dependent on the selected key and so peaks of the function match the in-key frequencies (for boosting functions) or out-of-key frequencies (for cutting functions).

Some example systems may automatically detect the key and scale of an input signal, for example a music composition. In such cases the system automatically detects the key and scale and automatically selects the key and scale for the window function.

Selector 2740 may be selected to select in-key notes or out of key notes. Control of the window shape function may be provided by user input 2760. The width of the window (bandwidth) may be selected by user input 2750. Further functions and settings including peak shape, centre frequency may also be controlled via the user interface.

Figure 28:
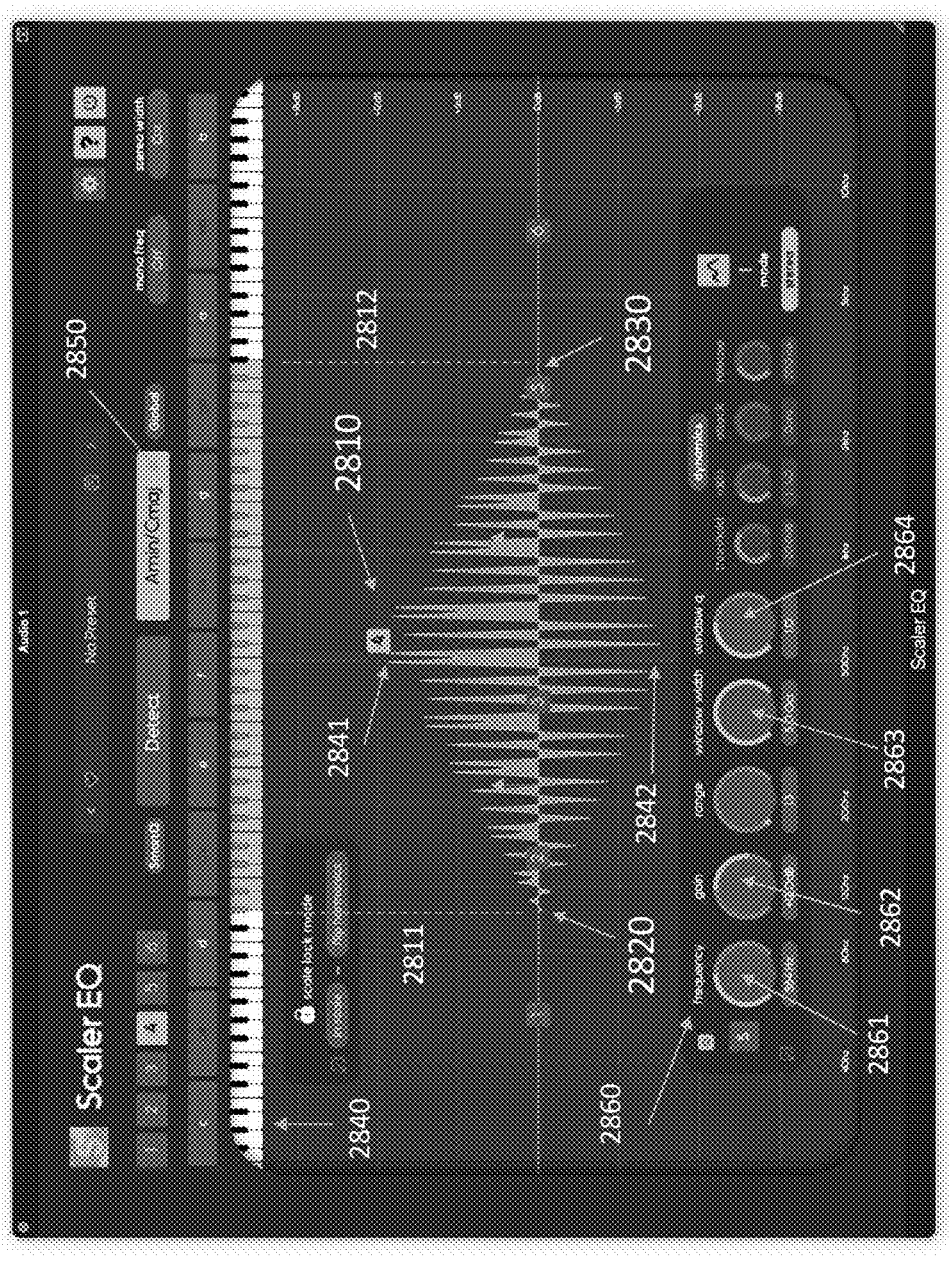
FIG. 28 shows a digital representation of an example of an audio processing function to be applied to an input signal.

FIG. 28 shows a further example of a signal processing function 2810. Signal processing function 2810 is configured to apply positive gain (boost) to in-key note frequencies and apply negative gain (cut) cut out-of-key note frequencies simultaneously across a frequency range (window).

The graphical user interface shown in FIG. 28 is a variation to that shown in FIGS. 5 to 27. Many of the same settings are included and displayed on the graphical user interface including signal processing function 2810, keyboard representation 2840 showing in-key and out-of-key notes, scale and key selection 2850 and various signal processing function settings 2860.

Signal processing function 2810 is tuned to the key of C major (A minor). The key of C major (A minor) includes in-key notes C D E F G A B. The out of key notes of A major (C minor) are C# Eb F# Ab Bb. Signal processing function 2810 applies a positive gain (boost) to in-key note frequencies within the selected frequency range and also applies a negative gain (cut) to out-of-key note frequencies within the selected frequency range.

The frequency range (window) of signal processing function 2810 extends across 5 octaves from the frequency of Ab 2811 across five octaves to the frequency of G 2812. The lowest frequency adjusted within the frequency range is Ab 2820. A negative gain (cut) is applied to the frequency corresponding to the note Ab. The highest frequency adjusted within the frequency range is G 2830. A positive gain (boost) is applied to the frequency corresponding to the note G.

Within the frequency range (window) between 2811 and 2812 a positive gain is applied to frequencies for the in-key notes of C major (A minor) and a negative gain (cut) is applied to frequencies of the out-of-key notes of C major (A minor).

The in-key boost/out-of-key cut signal processing function 2810 is applied within a single frequency range (window). This allows a producer to set a single signal processing function which simultaneously boosts some frequencies and cuts other frequencies from the input signal. For the signal processing function 2810 the user may select the centre frequency for the window. The user interface may include a centre frequency selector 2861 to allow the user to select the centre frequency. The width of the frequency range (window width) may also be selected, for example using an input selector 2863, allowing the user to select the frequency range across which the signal processing function 2810 is applied to the input signal. In the example of FIG. 28, the frequency range is set to five octaves. In different embodiments the frequency range may be defined in terms of musical notes or octaves, or it may be defined by frequency. The centre frequency selector 2861 and window width selector 2863 may be controlled via the user interface.

The settings for signal processing function may be applied to both the positive and negative gains or settings may be set independently for positive and negative gains.

The gain (either positive or negative) may be selected, for example using gain selector 2862. In the example of signal processing function 2810 the highest gain within the signal processing function is applied to the centre frequency of the frequency range (window). In the example of FIG. 28, the gain is not set to the maximum value (see gain setting 2862). In other example signal processing functions it is possible that the highest gain may be offset from the centre frequency of the window. The highest gain is applied at the centre frequency for both the positive gain 2841 and the negative gain 2842. The window shape function (sometimes referred to as window q) defines the amplitude adjustment for frequencies within the selected frequency range (window). In the example of 2810 the same window shape function is applied to the positive and negative gains. The shape function may be a bell curve function. The shape function may be symmetrical within the frequency range, for example symmetrical about the centre frequency. The window shape function may be selected using window q selector 2864. Window q selector 2864 and gain selector 2862 may be controlled via the user interface.

In signal processing function 2810 the gain applied to the centre frequency may be the same for positive gain and negative gain, for example the maximum gain at the centre frequency may be set at +12 dB for the in-key frequencies and −12 dB for the out-of-key frequencies. This equal gain of the signal processing function for boosting and cutting may be set automatically so the user only needs to set this once. In other examples, the amplitude of the maximum gain may be different for boosting and cutting, for example maximum negative gain may be set at 50% of negative gain, meaning if the centre frequency gain is +10 dB for the in-key frequencies it is −5 dbB for the out-of-key frequencies.

The example of signal processing function 2810 applies a positive gain (boost) to in-key frequencies and a negative gain (cut) to out-of-key frequencies. In other examples, signal processing functions may apply a positive gain (boost) to out-of-key frequencies and a negative gain (cut) to in-key frequencies The signal processing functions described above with respect to FIGS. 5 to 28 show examples of adjustments that may be applied to audio signals. The form of the signal processing function is controlled by a user using various settings via user interface 260 to produce different adjustments to the input signal. The examples of FIGS. 5 to 28 show various digital representations of the signal processing function displayed to the user. The signal processing functions define the gain to be applied to frequencies of the input signal.

The signal processing function may created within an EQ module executed by processors within the DAW, as described above, these processors may be local or accessed remotely via a communications network (sometimes referred to as in the cloud).

The signal processing function is applied to the input signal using processors. The function of applying the signal processing function to the input signal adjusts the waveform of the input signal to create an adjusted output signal. The output signal is sent to an output. The output signal is converted into sound, for example using a speaker or headset.

The signal processing function may be created digitally, for example via a graphical user interface but the signal processing function may be implemented by an analogue EQ.

In use, the system allows the user to play the audio signal and dynamically set and adjust the signal processing functions through the user interface. This provides the user with real-time feedback of the effect of the signal processing functions on the audio signal. This allows the user to use the window functions to identify in-key notes in the audio signal, for example by boosting those in-key notes, and for example using the flip harmonics function to remove the out-of-key notes by changing the polarity of the gain from boost to cut. The user may wish to identify the out-of-key notes using an out-of-key boost function to amplify those out-of-key notes and then switch off the flip harmonics function and change the polarity to cut the out-of-key notes from the audio signal by reducing their amplitude.

In systems, the settings can be adjusted dynamically via the user interface to allow the user to hear the effect of the signal processing function on the input audio. The signal processing settings can be updated through the user interface to allow a user to quickly zero in on frequency bands and remove frequencies that are out of scale with either a cut or subtle dynamic suppression (soothing). The sweep (i.e. adjustable window centre frequency) function allows a user to sweep around the frequency range to find musical areas and notes in key and scale and musically boost areas resulting in a warm and brilliant boost.

Control of the Q of the in-key and out-of-key frequencies allow narrow Q to boost to find harsh frequencies and specifically those out of key frequencies (inharmonic) and cut them whilst repeating this process several times. The inharmonic function allows automatic lock to inharmonic frequencies.

The key and scale lock feature locks to in-key and out-of-key note frequencies by manual or auto detection. The flip harmonics feature to cut out-of-key notes provides that boosts will be locked to notes in key and cuts will automatically lock to notes out of key.

The technical features of locking the EQ to key and scale opens up lots of possibilities such as sweeping, modulated resonant boosts, removing or boosting musicality within percussion tracks, new ways of sidechaining, widening or narrowing frequency bands in key using mid/side techniques. These features allow our users to create new and unique effects.

Flip harmonics function 1640 automatically swaps a boosting function for out-of-key frequencies to a cutting function for in-key frequencies (and vice-versa) when the user changes the polarity of the gain (i.e. boost to cut, or cut to boost). Boosting the in-key frequencies adds a pleasing warm effect by boosting harmonics naturally present in the signal that relate to the key and scale of the source. Cutting provides clarity but removing sounds not required in the original source according to the key and scale or the source material (in-harmonic frequencies)

The centre frequency of the can be selected and controlled by selecting the window icon 1610. In typical software control systems the icon may be selected by clicking and dragging using a mouse or other input control device. Example systems may include a magnifier (loupe) to zero in on frequencies. In other examples the centre frequency may be manually entered, for example via a keyboard.

Window width control function 1650 provides selection of the window width. A wider window width (bandwidth) extends across a larger range of frequencies and will include more notes. The frequency width may be selected by specific frequency or in in terms of octaves, for example the width may be set to two octaves.

Window Q control function 1660 controls the Q for the overall window. This may be referred to as the window shape function and defines the shape of the window function resulting in a convex shape or flat shape across the window.

It is to be understood that, if any prior art publication is referred to herein, such reference does not constitute an admission that the publication forms a part of the common general knowledge in the art, in Australia or any other country.

In the claims which follow and in the preceding description of the invention, except where the context requires otherwise due to express language or necessary implication, the word "comprise" or variations such as "comprises" or "comprising" is used in an inclusive sense, namely, to specify the presence of the stated features but not to preclude the presence or addition of further features in various embodiments of the invention.

It is to be understood that the a foregoing description refers merely to preferred embodiments of invention, and that variations and modifications will be possible thereto without departing from the spirit and scope of the invention, the ambit of which is to be determined from the following claims.

The invention claimed is:

1. A signal processing system for adjusting an audio signal, the signal processing system configured to:
   receive the audio signal for adjustment at a signal input;
   at a function generator, receive a selection of a musical key and scale, the musical key and scale including musical notes, and
   generate an audio signal processing function, configured to adjust amplitude of frequencies of the audio signal, the audio signal processing function being dependent on the selected musical key and scale;
   apply the audio signal processing function to the audio signal to generate an adjusted audio signal; and,
   output the adjusted audio signal at a signal output.

2. A signal processing system according to claim 1, the audio signal processing function configured to adjust the amplitude of frequencies of the audio signal, the signal processing function adjusting the amplitude of frequencies of the audio signal in dependence on the selected musical key and scale.

3. A signal processing system according to claim 2, the audio signal processing function adjusting the amplitude of frequencies of the audio signal in dependence on whether the frequency corresponds to a musical note.

4. A signal processing system according to claim 1, wherein amplitude of a frequency of the audio signal is adjusted in dependence on whether that frequency corresponds to a musical note which is in the selected musical key and scale or out of the selected musical key or scale.

5. A signal processing system according to claim 1, the audio signal processing function being configured to disproportionately adjust the amplitude of frequencies of notes which are in the selected musical key and scale or out of the musical key and scale compared with other frequencies.

6. A signal processing system according to claim 1, the audio signal processing function including peaks in gain at multiple frequencies, the peaks being positioned at frequencies in dependence on the selected musical key and scale.

7. A signal processing system according to claim 1, the audio signal processing function comprising a peak function, the peak function defines relationship between peak amplitude adjustment applied to note frequency and the amplitude adjustment applied to adjacent frequencies.

8. A signal processing system wherein the audio signal processing function comprises a first signal processing function according to claim 1 and a second signal processing function, the first signal processing function and the second signal processing function both adjusting the amplitude of frequencies in the audio signal and having an overlapping frequency range, wherein total amplitude adjustment applied to frequencies in the overlapping frequency range is a combination of the amplitude adjustment of the first signal processing function and the second signal processing function.

9. A signal processing system according to claim 1, wherein the selection of a musical key and scale is performed automatically or received from a manual input.

10. A method for adjusting an audio signal, comprising:
   receiving the audio signal for adjustment;
   receiving a selection of a musical key and scale, the musical key and scale including musical notes; and
   generating an audio signal processing function, the audio signal processing function configured to adjust amplitude of frequencies of the audio signal, the audio signal processing function being dependent on the selected musical key and scale;
   applying the audio signal processing function to the audio signal to generate an adjusted audio signal; and,
   outputting the adjusted audio signal.

11. A method according to claim 10, the audio signal processing function configured to adjust the amplitude of frequencies of the audio signal, the audio signal processing function adjusting the amplitude of frequencies of the audio signal in dependence on the selected musical key and scale.

12. A method according to claim 11, the audio signal processing function being further dependent on whether the frequency corresponds to a musical note.

13. A method according to claim 10, wherein amplitude of a frequency of the audio signal is adjusted in dependence on whether that frequency corresponds to a musical note which is in the selected musical key and scale or out of the selected musical key or scale.

14. A method according to claim 10, the audio signal processing function being configured to disproportionately adjust the amplitude of frequencies of notes which are in the selected musical key and scale or out of the musical key and scale compared with other frequencies.

15. A method according to claim 10, the audio signal processing function including multiple peaks in gain, the peaks being positioned at frequencies in dependence on the selected musical key and scale.

16. A method according to claim 10, the audio signal processing function comprising a peak function, the peak function defines relationship between peak amplitude adjustment applied to note frequency and amplitude adjustment applied to adjacent frequencies.

17. A method according to claim 10, further comprising a further audio signal processing function, the audio signal processing function and the further audio signal processing function both adjusting the amplitude of frequencies in the audio signal and having an overlapping frequency range, wherein total amplitude adjustment applied to frequencies of the audio signal in the overlapping frequency range is a combination of the amplitude adjustment of the audio signal processing function and the further audio signal processing function.

18. A computer implemented software module for adjusting an audio signal configured to perform the method of claim 10.

19. A method for generating a signal processing function for adjusting an audio signal, comprising: receiving a selection of a musical key and scale, the musical key and scale including musical notes; and generating an audio signal processing function, the audio processing function configured to adjust amplitude of frequencies of the audio signal, the audio signal processing function being dependent on the selected musical key and scale.

* * * * *